(12) United States Patent
Lee et al.

(10) Patent No.: US 12,139,814 B2
(45) Date of Patent: Nov. 12, 2024

(54) BORON NITRIDE LAYER, APPARATUS INCLUDING THE SAME, AND METHOD OF FABRICATING THE BORON NITRIDE LAYER

(71) Applicants: Samsung Electronics Co., Ltd., Suwon-si (KR); UNIST (ULSAN NATIONAL INSTITUTE OF SCIENCE AND TECHNOLOGY), Ulsan (KR)

(72) Inventors: Changseok Lee, Gwacheon-si (KR); Hyeonsuk Shin, Ulsan (KR); Hyeonjin Shin, Suwon-si (KR); Seokmo Hong, Ulsan (KR); Minhyun Lee, Suwon-si (KR); Seunggeol Nam, Suwon-si (KR); Kyungyeol Ma, Ulsan (KR)

(73) Assignees: Samsung Electronics Co., Ltd., Gyeonggi-do (KR); UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 18/298,692

(22) Filed: Apr. 11, 2023

(65) Prior Publication Data
US 2023/0272554 A1 Aug. 31, 2023

Related U.S. Application Data

(62) Division of application No. 17/082,502, filed on Oct. 28, 2020, now Pat. No. 11,624,127.

(30) Foreign Application Priority Data

Oct. 29, 2019 (KR) .................. 10-2019-0135755
May 6, 2020 (KR) .................. 10-2020-0054096

(51) Int. Cl.
*C30B 29/38* (2006.01)
*H01L 21/02* (2006.01)

(52) U.S. Cl.
CPC ........ *C30B 29/38* (2013.01); *H01L 21/02172* (2013.01); *H01L 21/02252* (2013.01); *H01L 21/02293* (2013.01)

(58) Field of Classification Search
CPC ... C30B 29/38; C30B 25/02; H01L 21/02172; H01L 21/02252; H01L 21/02293
See application file for complete search history.

(56) References Cited

U.S. PATENT DOCUMENTS 6,958,175 B2 10/2005 Sakamoto et al.
7,763,542 B2 7/2010 Kim et al.
(Continued)

FOREIGN PATENT DOCUMENTS

CN 103668016 A 3/2014
CN 103668106 A 3/2014
(Continued)

OTHER PUBLICATIONS

Extended European Search Report dated Mar. 19, 2021, issued in corresponding European Patent Application No. 20204299.0.
(Continued)

*Primary Examiner* — Robert M Kunemund
(74) *Attorney, Agent, or Firm* — HARNESS, DICKEY & PIERCE, P.L.C.

(57) ABSTRACT

A boron nitride layer and a method of fabricating the same are provided. The boron nitride layer includes a boron nitride compound and has a dielectric constant of about 2.5 or less at an operating frequency of 100 kHz.

20 Claims, 47 Drawing Sheets

(56) References Cited

U.S. PATENT DOCUMENTS

| | | | |
|---|---|---|---|
| 8,148,269 B2 | 4/2012 | Balseanu et al. | |
| 9,312,210 B2 | 4/2016 | Lee et al. | |
| 9,496,381 B2 | 11/2016 | Lee et al. | |
| 11,624,127 B2 * | 4/2023 | Lee | H01L 21/02293 117/94 |
| 2003/0003651 A1 | 1/2003 | Divakaruni et al. | |
| 2004/0083973 A1 | 5/2004 | Sakamoto et al. | |
| 2007/0082492 A1 | 4/2007 | Kim et al. | |
| 2014/0340172 A1 * | 11/2014 | Bradley | H03H 9/02015 333/187 |
| 2017/0345843 A1 | 11/2017 | Lee et al. | |
| 2018/0047679 A1 | 2/2018 | Cabral, Jr. et al. | |
| 2018/0342535 A1 | 11/2018 | Ramaswamy et al. | |
| 2019/0139833 A1 | 5/2019 | Cheng et al. | |
| 2019/0267463 A1 | 8/2019 | Chao et al. | |
| 2019/0280105 A1 | 9/2019 | Shen et al. | |
| 2019/0296024 A1 | 9/2019 | Ji et al. | |
| 2019/0355752 A1 | 11/2019 | Lee et al. | |
| 2020/0051921 A1 | 2/2020 | Lee et al. | |
| 2020/0266198 A1 | 8/2020 | Ji et al. | |
| 2021/0123161 A1 | 4/2021 | Lee et al. | |
| 2021/0125929 A1 | 4/2021 | Shin et al. | |
| 2021/0125930 A1 | 4/2021 | Shin et al. | |

FOREIGN PATENT DOCUMENTS

| | | |
|---|---|---|
| CN | 105568253 A | 5/2016 |
| CN | 106245001 A | 12/2016 |
| KR | 2003/0007722 A | 1/2003 |
| KR | 2004/0012972 A | 2/2004 |
| KR | 100620458 B1 | 9/2006 |
| KR | 2007/0040590 A | 4/2007 |
| KR | 100801736 B1 | 2/2008 |
| KR | 2013/0104850 A | 9/2013 |
| KR | 2013/0134712 A | 12/2013 |
| KR | 2016/0093375 A | 8/2016 |
| KR | 2017/0038499 A | 4/2017 |
| KR | 2017/0134039 A | 12/2017 |
| KR | 101983219 B1 | 5/2019 |
| KR | 2019/0112443 A | 10/2019 |
| KR | 2021/0052162 A | 5/2021 |

OTHER PUBLICATIONS

Extended European Search Report dated Mar. 12, 2021, issued in corresponding European Patent Application No. 20204602.5.

Lei Li and Xiang Ming Chen, 'On the measured dielectric constant of amorphous boron nitride' *Nature*, vol. 590, No. 7844, Feb. 2021, pp. E6-E10.

Jun Liu et al., 'Plasma deposition of low dielectric constant (k=2.2~2.4) Boron Nitride on methylsilsesquioxane-based nanoporous films' *Journal of Applied Physics*, vol. 96, No. 11, Dec. 2004, pp. 6679-6684.

S. V. Nguyen et al., 'Plasma-Assisted Chemical Vapor Deposition and Characterization of Boron Nitride Films' *Journal of the Electrochemical Society*, vol. 141, No. 6, Jun. 1994, pp. 1633-1638.

Seokmo Hong et al., 'Ultralow-dielectric-constant amorphous boron nitride' *Nature*, vol. 582, Jun. 2020, pp. 511-526.

Nicholas R. Glavin et al., 'Amorphous Boron Nitride: a Universal, Ultrathin Dielectric for 2D Nanoelectronics' *Advanced Functional Materials*, vol. 26, 2016, pp. 2640-2647.

R. Zedlitz et al., 'Properties of amorphous boron nitride thin films' *Journal of Non-Crystalline Solids* 198-200, 1996, pp. 403-406.

Korean Office Action dated Jun. 18, 2024 for corresponding Korean Patent Application No. 2020/0054106 and its English-language translation.

Korean Office Action dated Jun. 18, 2024 for corresponding Korean Patent Application No. 2020/0054096 and its English-language translation.

* cited by examiner

FIG. 7C

| Samples | B (at%) | N (at%) | H (at%) |
|---|---|---|---|
| a-BN | 47.6 | 46.9 | 5.5 |

FIG. 12

|      | Electrical properties | | Film properties | |
| --- | --- | --- | --- | --- |
|      | Dielectric constant @100 kHz / @1 MHz | Breakdown Field (MV-cm$^{-1}$) | Refractive index (n) @ 633 nm | Density (g-cm$^{-3}$) |
| h-BN | 3.28 / 2.87 | 2.2 | 2.16 | 2.1 |
| a-BN | 1.78 / 1.16 | 7.3 | 1.37 | 2.1~2.3 |

BORON NITRIDE LAYER, APPARATUS INCLUDING THE SAME, AND METHOD OF FABRICATING THE BORON NITRIDE LAYER

CROSS-REFERENCE TO RELATED APPLICATIONS

This application is a Divisional of U.S. patent application Ser. No. 17/082,502, filed Oct. 28, 2020 now U.S. Pat. No. 11,624,127, which claims the benefit of Korean Patent Application Nos. 10-2019-0135755, filed on Oct. 29, 2019, and 10-2020-0054096 filed on May 6, 2020, in the Korean Intellectual Property Office, the disclosures of each of which are incorporated herein in their entirety by reference.

BACKGROUND

1. Field

The present disclosure relates to boron nitride layers, apparatuses including the boron nitride layers, and methods of fabricating the boron nitride layers.

2. Description of Related Art

Electronic devices and semiconductor devices may be mostly fabricated by combining and connecting a semiconductor, an insulator, and a conductor. For example, electronic devices and semiconductor devices may be arranged to form a plurality of unit devices on a semiconductor substrate and then insulating layers (interlayer insulating layers) and electrode wires are repeatedly stacked thereon, thereby fabricating various integrated circuits.

However, in a process of fabricating or operating such devices, the temperature of constituent layers may increase and electrical stress may occur due to the application of a voltage/current. This may result in diffusion of materials (atoms) between adjacent constituent layers, which may deteriorate the properties of the devices and also reduce the reliability and durability thereof. As the degree of integration of such devices increases, it may be more difficult to solve problems caused by the diffusion of materials between the constituent layers. In addition, even when there is no diffusion of the material, a signal delay may occur due to mutual interference caused by an electric field between wires of a device having a high degree of integration.

SUMMARY

Provided are boron nitride layers having a dielectric constant and methods of fabricating the boron nitride layers.

Provided are apparatuses including boron nitride layers having a dielectric constant.

Additional aspects will be set forth in part in the description which follows and, in part, will be apparent from the description, or may be learned by practice of the presented embodiments of the disclosure.

According to an aspect of the present disclosure, a boron nitride layer includes a boron nitride compound and the boron nitride layer has a dielectric constant of about 2.5 or less at an operating frequency of 100 kHz.

In some embodiments, a ratio of boron to nitrogen of the boron nitride layer may be about 0.9 to about 1.1.

In some embodiments, the boron nitride layer may be non-porous.

In some embodiments, the boron nitride layer may include at least one pore.

In some embodiments, the boron nitride layer may have a mass density of about 1 to about 3 $g/cm^3$.

In some embodiments, a breakdown field of the boron nitride layer may be about 4 $MVcm^{-1}$ or more.

In some embodiments, a breakdown field of the boron nitride layer may be about 10 $MVcm^{-1}$ or less.

In some embodiments, a roughness of the boron nitride layer may be about 0.3 to about 0.6 root-mean-square (RMS).

In some embodiments, the boron nitride layer may have an energy band gap of about 6.00 eV or less.

In some embodiments, the nitrogen and the boron of the boron nitride compound may include an $sp^2$ bond.

In some embodiments, the boron nitride layer may have a hydrogen content ratio of about 10% or less.

In some embodiments, the boron nitride layer may have a dielectric constant of about 2.3 or less at the operating frequency of 100 kHz.

In some embodiments, the boron nitride layer may be amorphous.

In some embodiments, the boron nitride layer may have a dielectric constant of about 2.3 to about 2.5 at the operating frequency of 100 kHz.

In some embodiments, the boron nitride layer may include a nano crystal.

According to another embodiment, a method of fabricating a boron nitride layer includes preparing a substrate; and growing the boron nitride layer on the substrate using a plasma from a reaction gas including a boron nitride source at a temperature of about 700° C. or less.

In some embodiments, the preparing of the substrate may include pretreating the substrate.

In some embodiments, the plasma may include at least one of an inductively coupled plasma, a capacitively coupled plasma, a microwave plasma, a plasma enhanced method, an electron cyclotron resonance plasma, an arc discharge plasma, and a helicon plasma.

In some embodiments, the boron nitride layer may have a dielectric constant of about 2.5 or less at an operating frequency of 100 kHz.

In some embodiments, the boron nitride layer may include at least one of an amorphous structure and a nano crystal.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 7C shows a composition ratio of a boron nitride layer calculated using HR-RBS and HR-ERDA spectra;

FIG. 12 is a table summarizing the properties of an amorphous boron nitride layer and a hexagonal boron nitride layer according to an embodiment;

DETAILED DESCRIPTION

Figure 1:
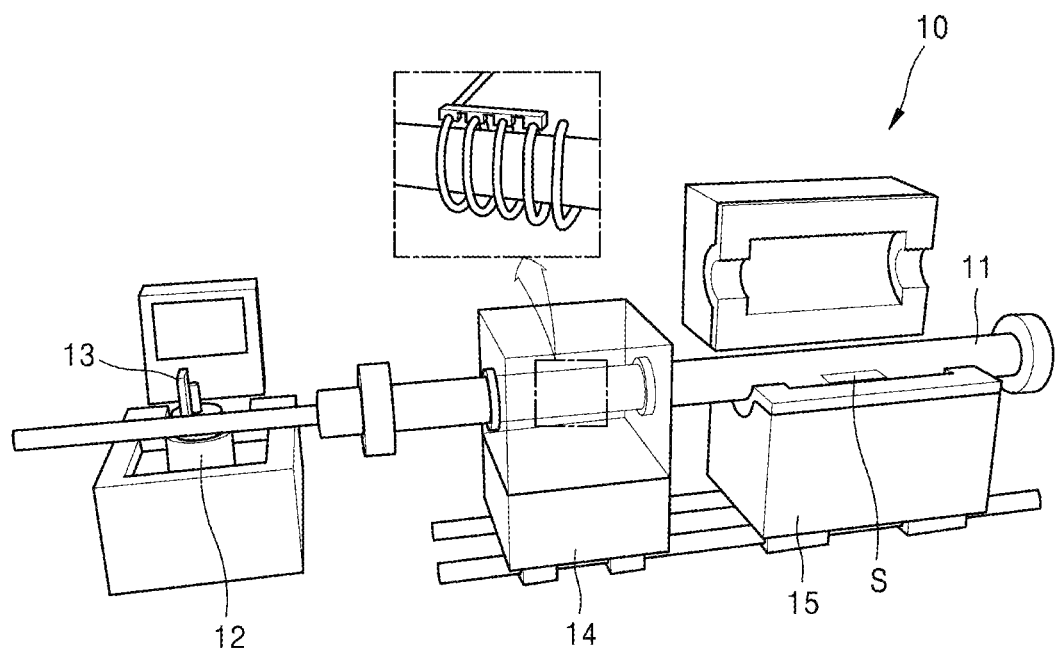
FIG. 1 is a diagram schematically showing a system for fabricating a boron nitride layer, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Reference will now be made in detail to embodiments, examples of which are illustrated in the accompanying drawings. In the accompanying drawings, wherein like reference numerals refer to like elements throughout. Also, the size of each layer illustrated in the drawings may be exaggerated for convenience of explanation and clarity. In this regard, the present embodiments may have different forms and should not be construed as being limited to the descriptions set forth herein.

It will also be understood that when an element is referred to as being "on" or "above" another element, the element may be in direct contact with the other element or other intervening elements may be present. An expression used in the singular encompasses the expression of the plural, unless it has a clearly different meaning in the context. It should be understood that, when a part "comprises" or "includes" an element in the specification, unless otherwise defined, other elements are not excluded from the part and the part may further include other elements. The use of the terms "the" and similar referents in the context are to be construed to cover both the singular and the plural.

In the embodiments below, a boron nitride layer, a method of fabricating the boron nitride layer by using plasma, and an apparatus including the boron nitride layer will be described.

FIG. 1 is a diagram schematically showing a system 10 for fabricating a boron nitride layer, according to an embodiment. Referring to FIG. 1, the system 10 for fabricating the boron nitride layer may include a chamber 11 including a space in which a reaction gas for growth of the boron nitride layer may move, a supply source 12 that supplies the reaction gas to the chamber 11, a flow rate controller 13 that controls the mass flow of the reaction gas moving to the chamber 11, a plasma apparatus 14 that generates plasma in the chamber 11 and a furnace 15 that adjusts the temperature of the chamber 11, and may deposit the boron nitride layer in the chamber 11. In addition, the apparatus for adjusting the temperature may be a hot wall type in which radiant heat is transferred to a substrate, or a cold wall type in which the substrate is directly heated.

Figure 2A:
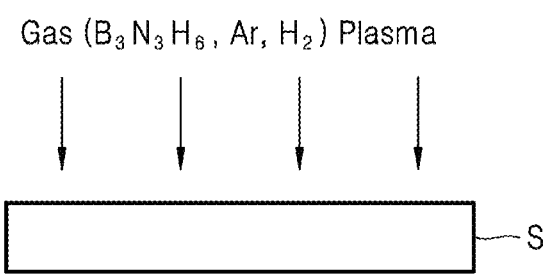
FIGS. 2A to 2C are reference diagrams illustrating a method of fabricating a boron nitride layer, according to an embodiment.
Figure 2B:
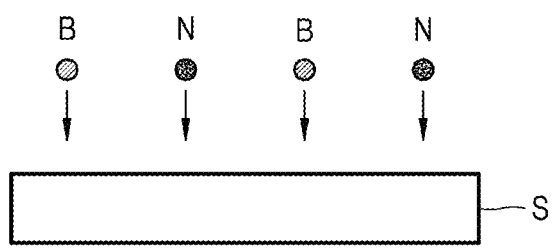
Figure 2C:

FIGS. 2A to 2C are reference diagrams illustrating a method of fabricating a boron nitride layer, according to an embodiment.

First, a substrate S may be prepared in the chamber 11 of the system 10. The substrate S may include at least one of a Group IV semiconductor material, a semiconductor compound, an insulating material, and metal. As a specific example, the substrate S may include the Group IV semiconductor material such as Si, Ge, or Sn. Alternatively, the substrate S may include at least one of Si, Ge, C, Zn, Cd, Al, Ga, In, B, C, N, P, S, Se, As, Sb, Te, Ta, Ru, Rh, Ir, Co, Ta, Ti, W, Pt, Au, Ni, and Fe. In addition, the substrate S may further include, for example, N and F as a SiCOH-based composition, and may also include pores to lower the permittivity. In addition, the substrate S may further include a dopant. The materials of the substrate S mentioned above are merely examples.

The substrate S may be pretreated before the substrate S is disposed in the chamber 11. For example, the substrate S may be immersed in an organic solvent such as acetone, sonicated, and then cleaned with iso-propenyl alcohol (IPA) and nitrogen gas. A plasma treatment such as oxygen, hydrogen, $NH_3$, etc. may be performed on the surface of the substrate S, which is cleaned, such that carbon impurities remaining on the surface may be removed. In addition, the substrate S may be immersed in an HF solution to remove natural oxides or remove a residual HF solution using anhydrous ethanol and $N_2$ gas.

The process temperature for growing the boron nitride layer may be about 700° C. or less, which is lower than the temperature used for a chemical vapor deposition process. For example, the process temperature of the inside of the chamber 11 may be about 400° C. Before the process temperature rises, the process pressure for growing the boron nitride layer may be set to about 2 Torr or less. For example, the process pressure may be $10^{-2}$ Torr or less.

Next, a reaction gas for growing the boron nitride layer may be injected into the chamber 11. Here, the reaction gas may be a source for boron nitride for the growth of the boron nitride layer and may be a source including both nitrogen and boron, such as borazine ($B_3N_3H_6$) or ammonia-borane ($NH_3$—$BH_3$). Alternatively, the reaction gas may include a nitrogen source including nitrogen and a boron source including boron. The nitrogen source may include at least one of ammonia ($NH_3$) or nitrogen ($N_2$), and the boron source may include at least one of $BH_3$, $BF_3$, $BCl_3$, $B_2H_6$, $(CH_3)_3B$, and $(CH_3CH_2)_3B$.

The reaction gas may further include an inert gas. The inert gas may include, for example, at least one of argon gas, neon gas, nitrogen gas, helium gas, krypton gas, and xenon gas. The reaction gas may further include a hydrogen gas. In addition, the mixing ratio of the reaction gas injected into the chamber 11 may be variously modified according to the growth conditions of the boron nitride layer.

The flow rate controller 13 may control the flow rate of the reaction gas flowing into the chamber 11. The flow rate of the boron nitride gas may be lower than other reactant gases. When the boron nitride layer is to grown using plasma, the mixing ratio of the reaction gas injected into the chamber 11, that is, the volume ratio of the source of boron nitride and the inert gas, may be, for example, about 1:10 to 5000, and the volume ratio of the source of boron nitride, the inert gas, and the hydrogen gas, may be, for example, about 1:10 to 5000:10 to 500.

Since the source for boron nitride is significantly smaller in proportion to other reaction gases, the crystallinity of boron nitrides may be weak. Thus, the boron nitride layer according to an embodiment may be formed in an amorphous or a nano-sized crystal structure.

When an excess amount of the source for boron nitride is supplied, the boron nitride layer may grow irregularly, and a precursor may be adsorbed, and thus, the flow rate of the source for boron nitride may be low.

For example, while growing the boron nitride layer, the flow rate controller 13 may control the flow rate of the source for boron nitride to 0.05 sccm, the flow rate of the inert gas to 50 sccm, and the flow rate of the hydrogen gas to 20 sccm. The flow rate controller 13 controls the flow rates of the boron nitride source and the inert gas, but is not limited thereto. The flow rate controller 13 may control only the flow rate of the source for boron nitride.

Subsequently, the plasma apparatus 14 may generate plasma inside the chamber 11 while the source for boron nitride is introduced into the chamber 11. Here, the power for plasma generation may be about 10 W to about 4000 W. For example, the power for plasma generation is about 30 W, but is not limited thereto.

The plasma apparatus 14 may be an apparatus that provides plasma including an inductively coupled plasma, a capacitively coupled plasma, a microwave plasma, a plasma enhanced method, an electron cyclotron resonance plasma, arc discharge plasma, a helicon plasma, etc., but is not limited thereto. For example, an inductively coupled plasma apparatus may provide a kind of plasma in which energy is supplied by a current generated by electromagnetic induction, that is, a magnetic field that changes over time. When the power for generating plasma is applied to the inside of the chamber 11 from the plasma apparatus 14, an electric field may be induced inside the chamber 11. As described above, when the electric field is induced in a state where the reaction gas is injected, plasma for the growth of a boron nitride layer BN may be formed.

Referring to FIG. 2B, activated nitrogen N* and activated boron B* may be generated by the plasma of the reaction gas in which the carbon source, the inert gas, and the hydrogen gas are mixed and may be adsorbed onto the surface of the substrate S. In addition, the plasma of the inert gas may continuously induce the activation of the substrate S, and thus, the adsorption of the activated nitrogen N* and the activated boron B* onto the surface of the substrate S may be accelerated. The activated nitrogen N* and the activated boron B* may be adsorbed as amorphous. Even if activated nitrides and boron are combined with each other, since an amount thereof is small, activated nitrides and boron may be adsorbed as the nano-sized crystal.

Referring to FIG. 2C, as the adsorption of the activated nitrogen N* and the activated boron B* onto the surface of the substrate S is accelerated even at a low temperature, the boron nitride layer BN may grow on the surface of the substrate S. According to the present embodiment, since the boron nitride layer BN directly grows on the surface of the substrate S by a low ratio of the activated nitrogen N* and the activated boron B* at a low temperature, for example, at a temperature of 700° C. or less, the boron nitride layer BN, which is grown, may have weak crystalline.

The boron nitride layer BN according to an embodiment may grow as amorphous or may nitride grow as the nano-sized crystal. Although there is a crystal in the boron nitride layer BN formed as amorphous, there may be a crystal of 3 nm or less, and the boron nitride layer BN formed as the nano crystal may include crystals having a size of about 100 nm or less. More specifically, the boron nitride layer BN may include crystals having a size of about 0.5 nm to about 100 nm.

The thickness of the boron nitride layer BN according to an embodiment may be about 100 nm or less. For example, the thickness of the boron nitride layer BN may be 50 nm or less. Further, the boron nitride layer BN may be formed to be thin because the boron nitride layer BN includes amorphous or nano crystals. However, the boron nitride layer BN is not limited thereto. Since the boron nitride layer BN includes amorphous or nano crystals, the boron nitride layer BN may be formed to be thick. The thickness of the boron nitride layer BN may be selected according to the field of application.

After growth, the plasma may be turned off and the furnace 15 may be gradually cooled at the room temperature. For example, the furnace 15 may be cooled at the room temperature by introducing 20 sccm of $H_2$ gas into the chamber 11.

A device may be fabricated by forming another layer on the boron nitride layer BN fabricated by using the above-described method. Alternatively, the fabricated boron nitride layer BN may be transferred to another layer. When transferred, a hydrofluoric acid transfer technique may be applied, but the present disclosure is not limited thereto.

The boron nitride layer BN fabricated as shown in FIGS. 2A to 2C may be amorphous. Although the boron nitride layer BN according to an embodiment includes a crystal, the boron nitride layer BN may include the nano-sized crystal. Because activated nitrogen and boron of a low density directly grow at a low temperature, the crystallinity may be weak. The lower at least one of the growth temperature and the process pressure, the higher the content of amorphous.

In the boron nitride layer BN according to an embodiment, the ratio of nitrogen and boron may be substantially the same. The ratio of boron to nitrogen may be about 0.9 to about 1.1. Further, the boron nitride layer BN may contain hydrogen, but the hydrogen content in the boron nitride layer BN may be small. For example, hydrogen may be about 10% or less. The boron nitride layer BN may be chemically stable because of its low content of hydrogen.

The boron nitride layer BN according to an embodiment may have a dielectric constant of 3 or less at an operating frequency of about 100 kHz (here, the dielectric constant may mean a relative dielectric constant versus vacuum or air). For example, an amorphous boron nitride layer a-BN may have a dielectric constant of 2.3 or less at the operating frequency of about 100 kHz, and a nanocrystalline boron nitride layer nc-BN may have a dielectric of 2.3 to 2.5 at the operating frequency of about 100 kHz.

In addition, the mass density of the boron nitride layer BN according to an embodiment may vary according to the dielectric constant of the boron nitride layer BN. For example, the boron nitride layer BN according to an embodiment may have a mass density of 1 to 3 $g/cm^2$.

In addition, the breakdown field of the boron nitride layer BN according to an embodiment may be 4 $MVcm^{-1}$ or more. Specifically, the breakdown field of the boron nitride layer BN according to an embodiment may be about 5 to about 10 $MVcm^{-1}$.

The boron nitride layer BN according to an embodiment may have a smooth surface. For example, the surface of the boron nitride layer BN may have a root-mean-square (RMS) roughness value of about 0.3 to about 0.6. The surface roughness of the boron nitride layer BN may be determined by the flow rate of the source for boron nitride.

To obtain the properties of the boron nitride layer BN, the boron nitride layer BN was grown on a Si substrate by an inductively coupled plasma-chemical vapor deposition (ICP-CVD) method at a process pressure of about $10^{-4}$ Torr and a process temperature of about 400° C.

Figure 3A:
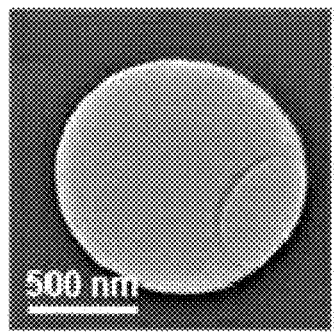
FIGS. 3A to 3D are diagrams showing an atomic structure of a boron nitride layer according to an embodiment.
Figure 3B:
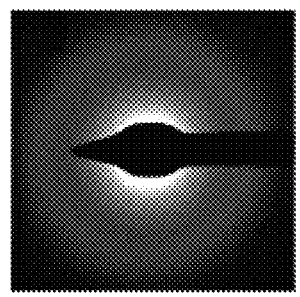
Figure 3C:
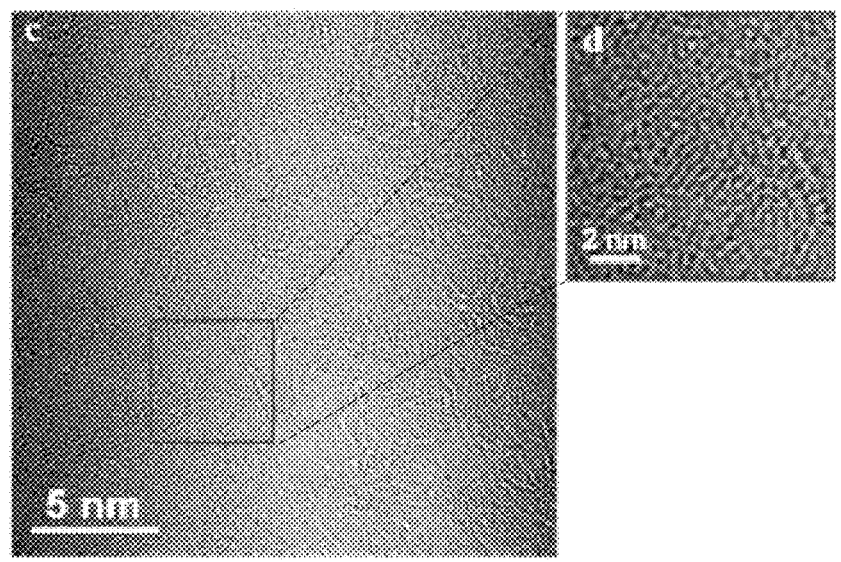
Figure 3D:
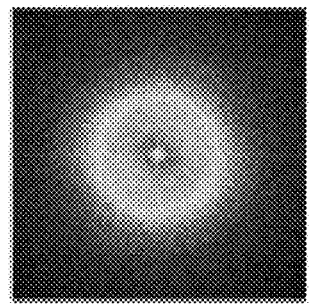

FIGS. 3A to 3D are diagrams showing an atomic structure of a boron nitride layer according to an embodiment. FIG. 3A is a low magnification transmission electron microscopy (TEM) image of the boron nitride layer, and FIG. 3B is an image of selective area electron diffraction of the boron nitride layer. The image of FIG. 3B shows a diffusion pattern with no discernible crystalline rings. FIG. 3C is a high magnification TEM image of the boron nitride layer in which atoms of the boron nitride layer are arranged in disorder. In addition, FIG. 3D is a diagram showing a fast Fourier transform result for the boron nitride layer and shows a typical diffusion diffraction pattern of an amorphous film. Therefore, it may be confirmed that the boron nitride layer fabricated by the fabricating method according to an embodiment is amorphous.

Figure 4A:
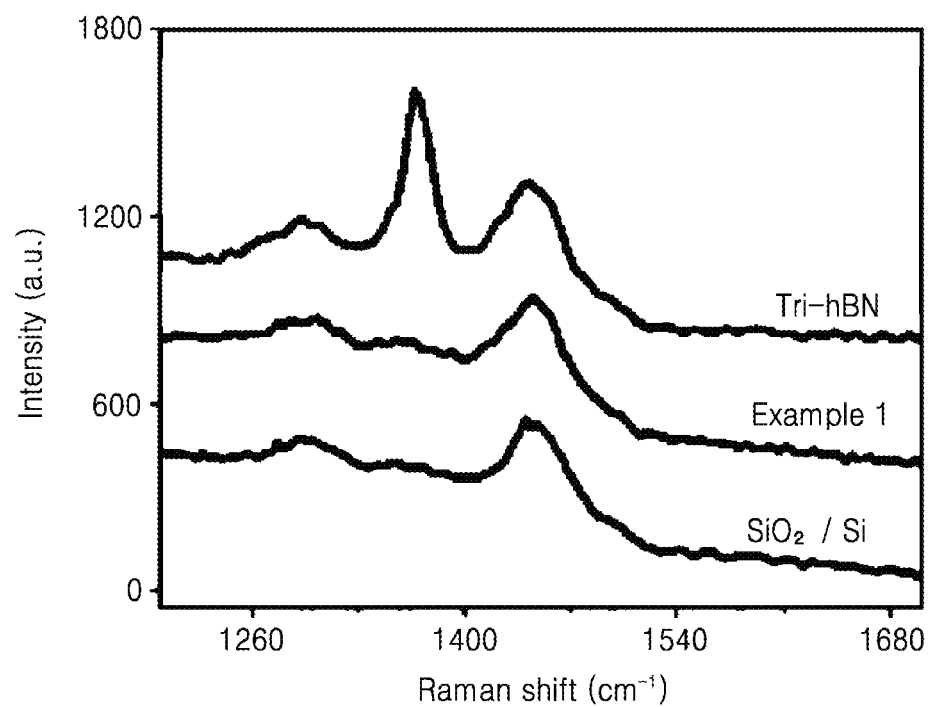
FIG. 4A is a Raman spectrum result with regard to a boron nitride layer according to an embodiment.

FIG. 4A is a Raman spectrum result of a boron nitride layer according to an embodiment. $SiO_2/Si$ is a Raman spectrum result measured with respect to a substrate itself, for example, a substrate including $SiO_2/Si$, and Example 1 is a Raman spectrum result measured after forming the boron nitride layer a-BN according to an embodiment on the substrate including $SiO_2/Si$, and Tri-hBN is a Raman spectrum result measured after epitaxially growing a three-layer hexagonal boron nitride layer on the substrate including $SiO_2/Si$.

As shown in FIG. 4A, the Raman spectrum of the substrate and the Raman spectrum of the boron nitride layer according to an embodiment are similar to each other. When comparing the amorphous boron nitride layer a-BN according to an embodiment and the three-layer hexagonal boron nitride layer Tri-hBN, it may be confirmed that a peak present in the three-layer hexagonal boron nitride layer Tri-hBN at 1373 $cm^{-1}$ is not present in the amorphous boron nitride layer a-BN. This may mean that the boron nitride layer a-BN according to an embodiment does not have crystallinity included in the hexagonal boron nitride layer Tri-hBN.

Figure 4B:
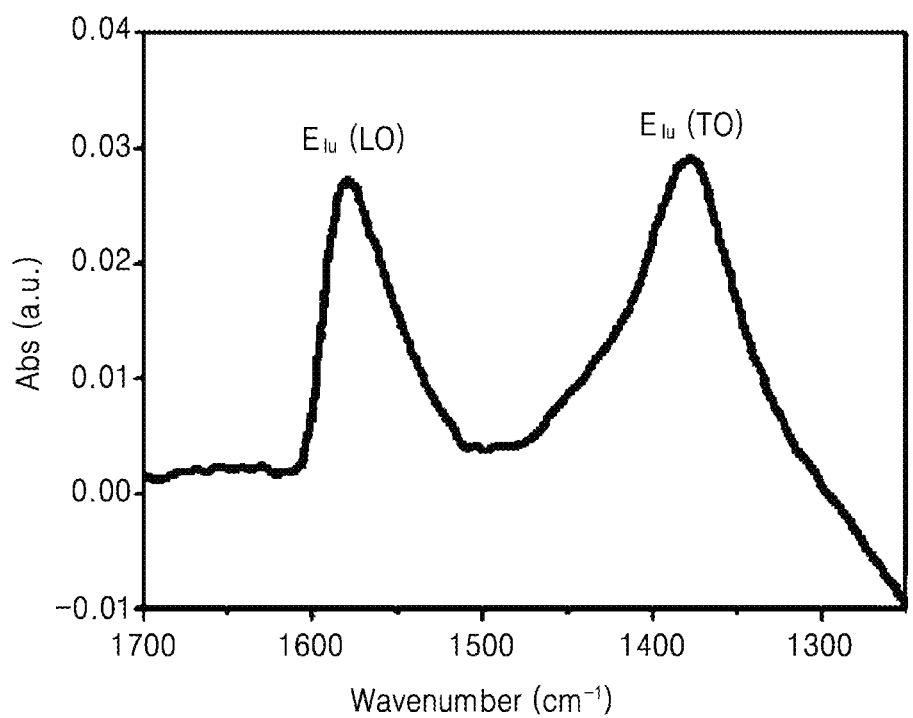
FIG. 4B shows a Fourier transform infrared spectroscopy (FTIR) spectrum result with regard to a boron nitride layer according to an embodiment.

FIG. 4B shows a Fourier transform infrared spectroscopy (FTIR) spectrum result of a boron nitride layer according to an embodiment. FTIR spectrum of the boron nitride layer is measured using s-polarised radiation at an incident angle of 60°. As shown in FIG. 4B, it may be confirmed in the boron nitride layer according to an embodiment that there is an absorption peak near 1370 cm$^{-1}$ that is attributed to a transverse optical mode, whereas there is another absorption peak near 1570 cm$^{-1}$. The absence of a peak near 1570 cm$^{-1}$ means that the boron nitride layer according to an embodiment has amorphous properties.

According to various experimental results, it may be confirmed that the boron nitride layer formed at a process temperature of about 400° C. is amorphous. Hereinafter, the boron nitride layer formed by using the fabricating method according to an embodiment at the process temperature of about 400° C. is referred to as the amorphous boron nitride layer a-BN.

Figure 5:
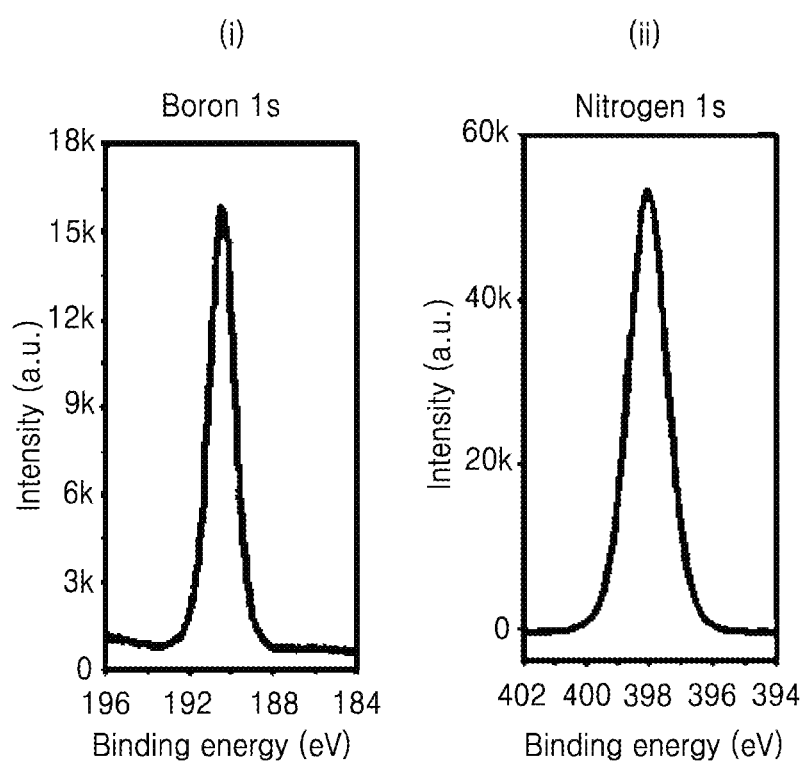
FIG. 5 is a diagram illustrating an X-ray photoelectron spectroscopy (XPS) profile result with regard to an amorphous boron nitride layer according to an embodiment.

FIG. 5 is a diagram illustrating an X-ray photoelectron spectroscopy (XPS) profile result of the amorphous boron nitride layer a-BN according to an embodiment. As shown in FIG. 5, it may be confirmed that peaks of 1 s of boron and 1 s of nitrogen are 190.4 eV and 397.9 eV, respectively. It may be confirmed from the XPS profile of FIG. 5 that the atom ratio of boron and nitrogen is about 1:1.08 based on the size of the peak of each of boron and nitrogen and includes a sp$^2$ combination.

Figure 6:
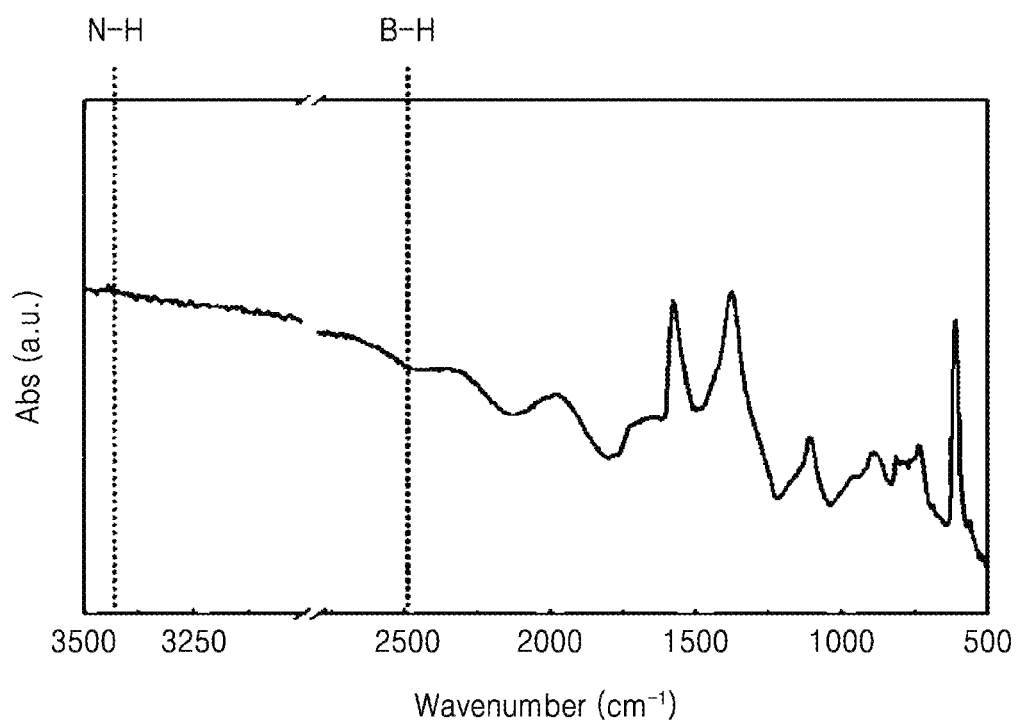
FIG. 6 shows a FTIR spectrum result with regard to an amorphous boron nitride layer according to an embodiment.

FIG. 6 shows a FTIR spectrum result of the amorphous boron nitride layer a-BN according to an embodiment. As shown in FIG. 6, no peak was observed in the FTIR spectrum at frequencies corresponding to B—H and N—H.

Figure 7A:
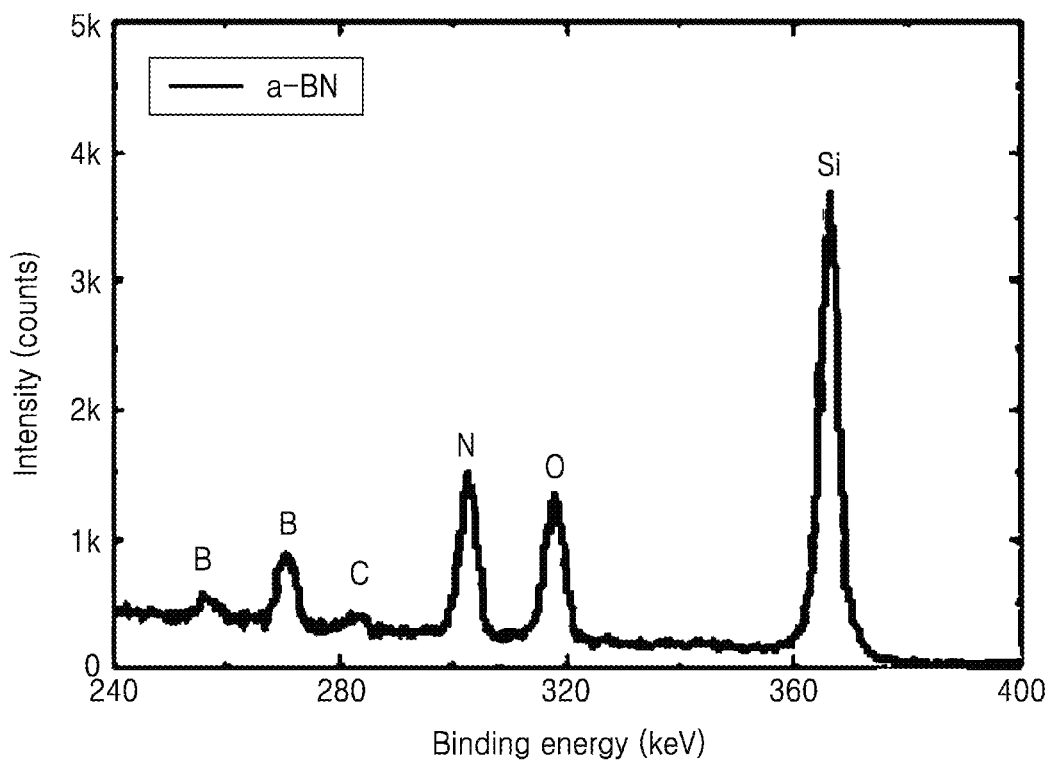
FIG. 7A shows a high-resolution Rutherford backscattering spectrometry (HR-RBS) profile result with regard to an amorphous boron nitride layer according to an embodiment.
Figure 7B:
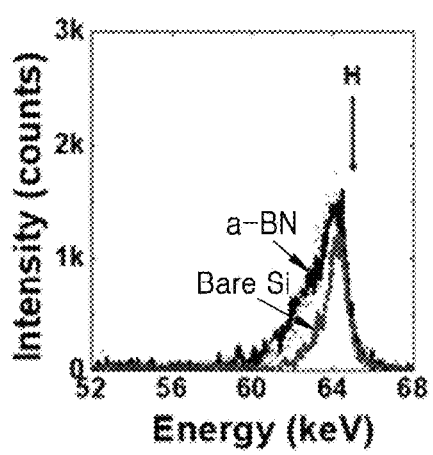
FIG. 7B shows a high-resolution elastic recoil detection analysis (HR-ERDA) profile result with regard to an amorphous boron nitride layer according to an embodiment.

FIG. 7A shows a high-resolution Rutherford backscattering spectrometry (HR-RBS) profile result for the amorphous boron nitride layer a-BN according to an embodiment, and FIG. 7B shows a high-resolution elastic recoil detection analysis (HR-ERDA) profile result for the amorphous boron nitride layer a-BN according to an embodiment. FIG. 7A shows the result measured within the energy range of 240-400 keV and FIG. 7B shows the result measured within the energy range of 52-68 keV, wherein it may be seen that Si and O which are atoms of a substrate were measured and B and N which are atoms of a boron nitride layer were measured. In addition, it may be seen that hydrogen was measured.

Figure 7C:
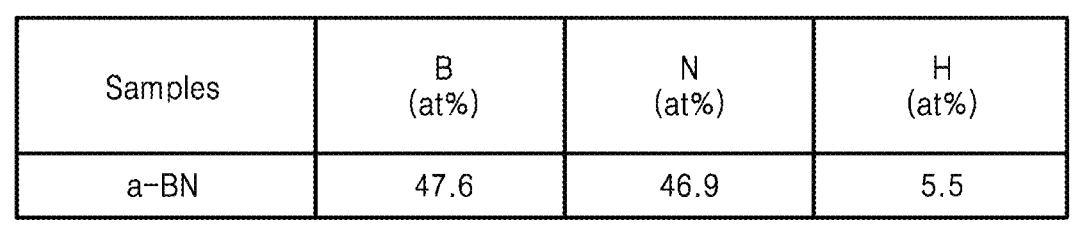

FIG. 7C shows a composition ratio of a boron nitride layer calculated using HR-RBS and HR-ERDA spectra. As shown in FIG. 7C, it may be confirmed that the ratio of boron and nitrogen is about 1.04:1. In addition, it may be confirmed that hydrogen in the boron nitride layer is about 5.5%.

The properties of the boron nitride layer grown on a substrate are confirmed above. The boron nitride layer according to an embodiment may be grown on a substrate including a catalyst material and then transferred to another substrate.

Figure 8A:
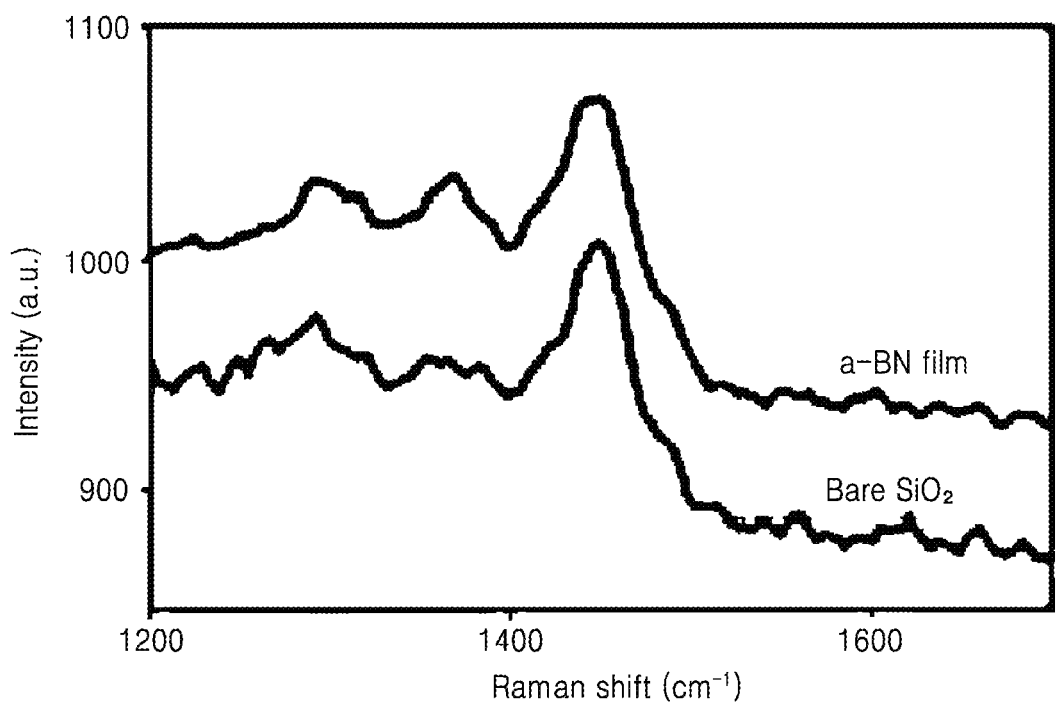
FIG. 8A shows a Raman spectrum result with regard to a boron nitride layer transferred to a substrate according to an embodiment.
Figure 8B:
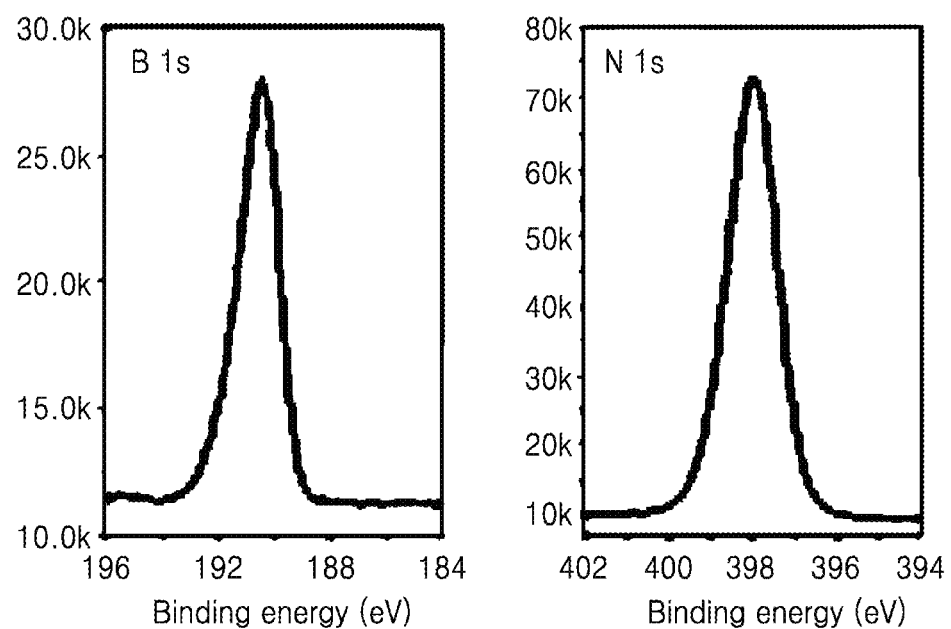
FIG. 8B is an XPS image of a transferred boron nitride layer according to an embodiment.

FIGS. 8A and 8B are diagrams illustrating the properties of a transferred boron nitride layer according to an embodiment. FIG. 8A shows a Raman spectrum result of the boron nitride layer transferred to a SiO$_2$ substrate according to an embodiment. The boron nitride layer is grown on a copper foil at a plasma power of about 30 W and a growth temperature of about 300° C. Then, the grown boron nitride layer was transferred to the SiO$_2$ substrate, and then a Raman spectrum was obtained. It may be confirmed that the Raman spectrum of the SiO$_2$ substrate on which the boron nitride layer is not grown and the Raman spectrum of the transferred boron nitride layer are similar. This may confirm that the transferred boron nitride layer is also amorphous like the SiO$_2$ substrate.

FIG. 8B is an XPS image of a transferred boron nitride layer according to an embodiment. As shown in FIG. 8B, it may be confirmed that peaks of 1 s of boron and 1 s of nitrogen are 190.4 eV and 397.9 eV, respectively, in the same manner as the boron nitride layer grown at the process temperature of about 400° C. It may be confirmed from the XPS profile of FIG. 8B that the atom ratio of boron and nitrogen is about 1:1.08 based on the size of the peak of each of boron and nitrogen and includes a sp$^2$ combination. Therefore, it may be confirmed that even when the growth substrate is a catalyst substrate, the amorphous boron nitride layer a-BN may be obtained by growing the boron nitride layer at a low temperature.

The dielectric properties of the amorphous boron nitride layer a-BN are described below. The dielectric constant is a physical measure of how easily electric dipoles may be induced in materials by application of an electrical field. The dielectric constant of air or vacuum is 1, but electric polarizability in solid state matter arises from dipolar, atomic and electronic components that are most relevant for high performance electronics. The contributions from these may be measured as a function of frequencies ranging from about 10-kHz to about 30-MHz. The dielectric constant may be measured using capacitance-frequency measurements on metal-insulator-metal (MIM) structures. The relative dielectric constants for the amorphous boron nitride layer a-BN and a hexagonal boron nitride layer h-BN were measured, for comparison, at different frequencies.

Figure 9A:
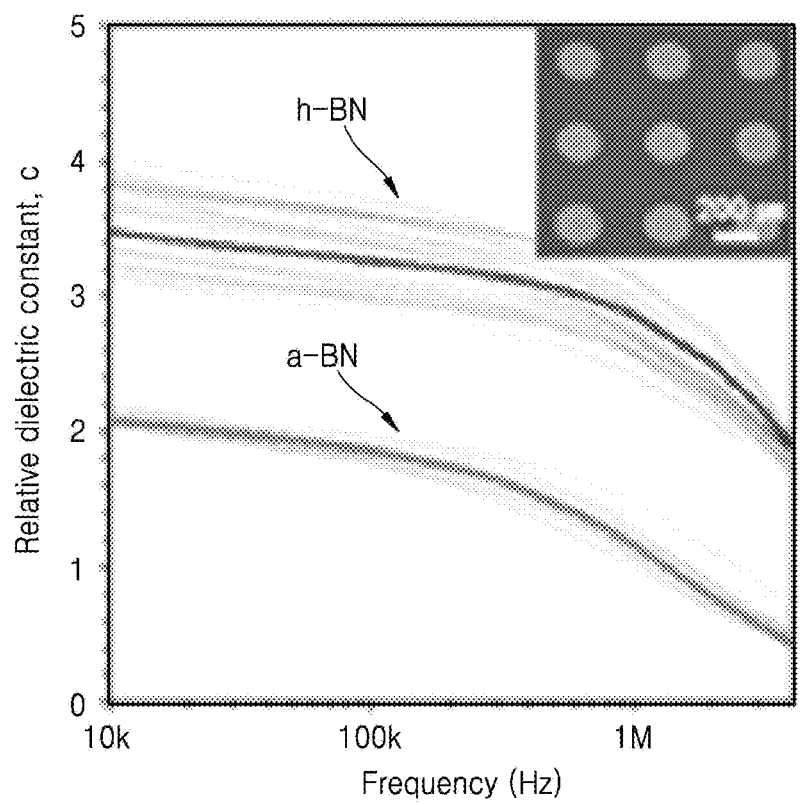
FIG. 9A shows a result of measuring dielectric constant of an amorphous boron nitride layer according to an embodiment.

FIG. 9A shows a result of measuring a dielectric constant of the amorphous boron nitride layer a-BN according to an embodiment. The dielectric constant shown in FIG. 9A is an average value of dielectric constants measured more than 50 times. As shown in FIG. 9A, the dielectric constants of the amorphous boron nitride layer a-BN and the hexagonal boron nitride layer h-BN may be inversely proportional to the operating frequency. It may be confirmed that the dielectric constants of the amorphous boron nitride layer a-BN and the hexagonal boron nitride layer h-BN are about 2 and 3.5, respectively, at an operating frequency of about 10 kHz. It may be confirmed that the dielectric constants of the amorphous boron nitride layer a-BN and the hexagonal boron nitride layer h-BN are about 1.78 and 3.28, respectively, at an operating frequency of about 100 kHz. It may be confirmed that the dielectric constant of the amorphous boron nitride layer a-BN at 1 MHz frequency reduces to about 1.16, which is close to the dielectric constant of air or vacuum. This is because the low dielectric constant of the amorphous boron nitride layer a-BN is attributed to nonpolar bonds between BN and also absence of order that prevents dipole alignment even at a high frequency.

A refractive index n of a boron nitride layer may be measured using a spectroscopic ellipsometry (SE) measurement method and a dielectric constant k thereof may be obtained using the relationship of the refractive index n and the dielectric constant k is that n$^2$=k.

Figure 9B:
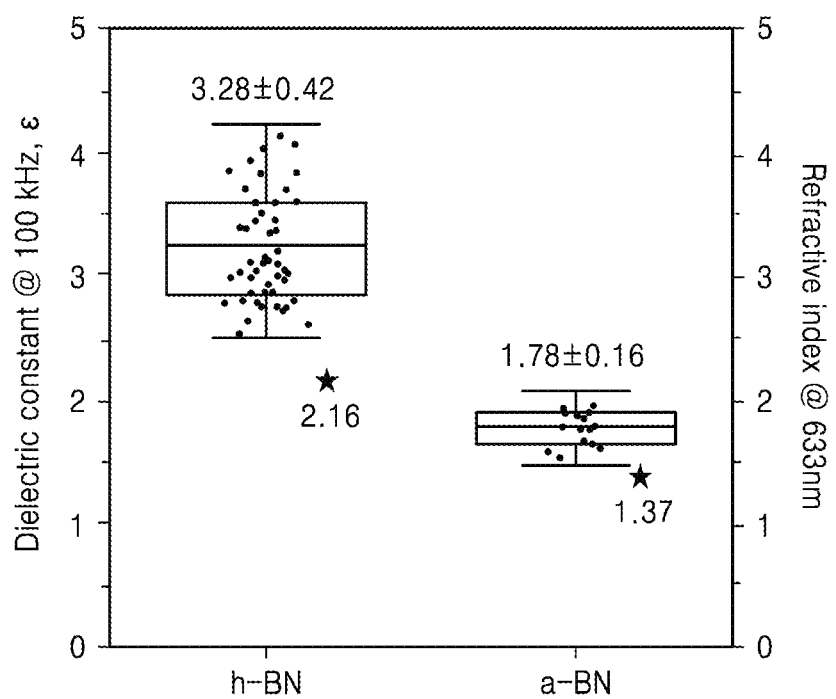
FIG. 9B shows a result with regard to a dielectric constant of a boron nitride layer obtained by using a spectroscopic ellipsometry (SE) measurement method.

FIG. 9B shows a result of a dielectric constant of a boron nitride layer using the SE measurement method. The refractive indices of the hexagonal boron nitride layer h-BN and the amorphous boron nitride layer a-BN at 633 nm wavelength using the SE measurement method were 2.16 and 1.37, respectively. Thus, it may be confirmed that the dielectric constants for the hexagonal boron nitride layer h-BN and the amorphous boron nitride layer a-BN are 4.67 and 1.88, respectively, and are closely identical to values obtained with electrical measurements at 100 kHz.

Figure 10A:
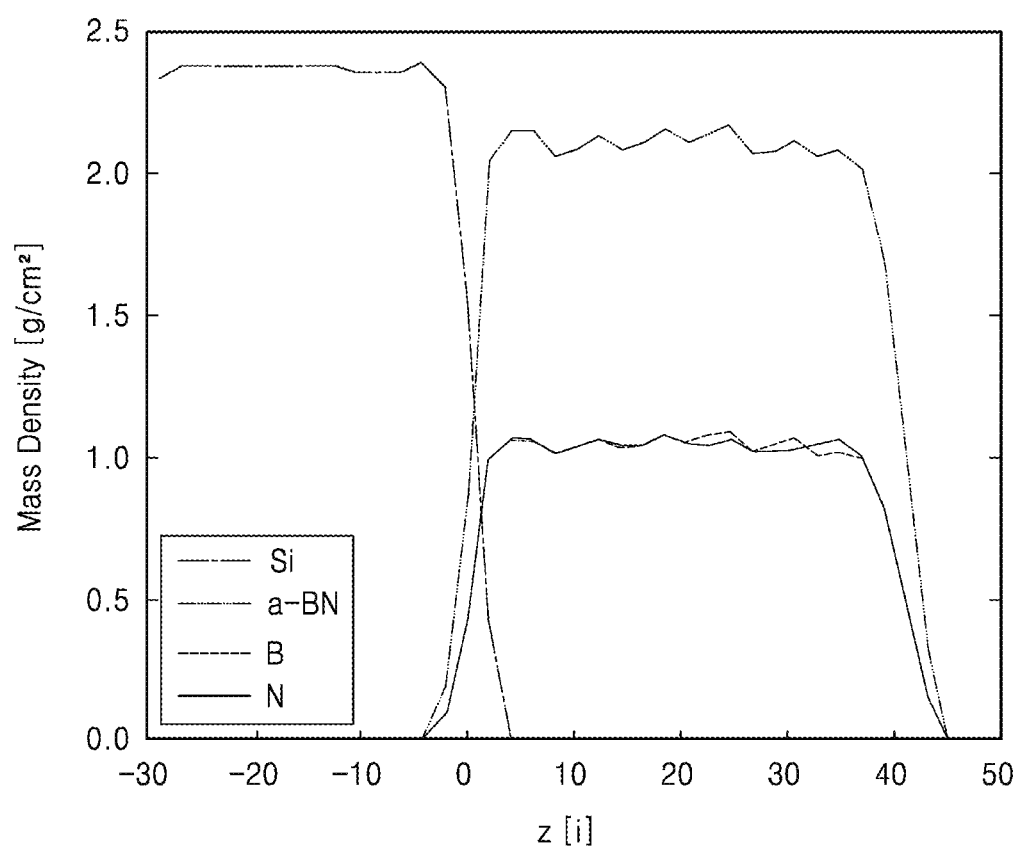
FIG. 10A is a simulation result with regard to a mass density of an amorphous boron nitride layer according to an embodiment.

FIG. 10A is a result of simulating a mass density of the amorphous boron nitride layer a-BN according to an embodiment. The amorphous boron nitride layer a-BN having a thickness of 40 nm was grown on a Si substrate, and then the mass density was simulated along the z direction which is the thickness direction of the amorphous boron nitride layer a-BN on the Si substrate. As shown in FIG.

10A, it may be confirmed that the mass density of the amorphous boron nitride layer a-BN is about 2 g/cm$^3$. It may be seen that the amorphous boron nitride layer a-BN has a low dielectric constant and a high density such that mechanical strength does not deteriorate.

Figure 10B:
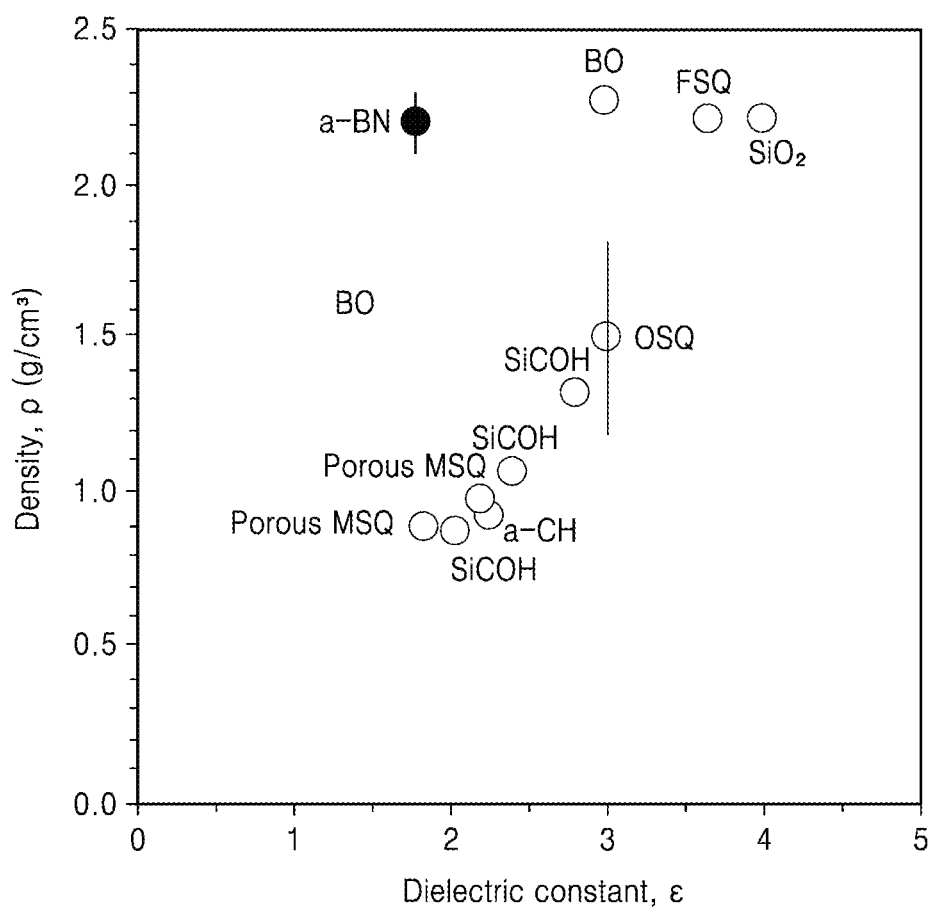
FIG. 10B is a graph showing the relationship between the dielectric constant and mass density of various materials.

FIG. 10B is a graph showing the relationship between the dielectric constant and mass density of various materials. As shown in FIG. 10B, the dielectric constant and the mass density of a material are generally proportional. Thus, a material having a low dielectric constant may have a low mass density and a low mechanical strength. However, the amorphous boron nitride layer a-BN having the dielectric density of about 2 has the mass density of about 2 which is relatively higher than other materials. Thus, the amorphous boron nitride layer a-BN may have a high mechanical strength.

Meanwhile, as another method of implementing low dielectric materials, in order to utilize a low dielectric constant of air, the materials are made porous. However, this may decrease the density of the material, which in turn results in poor mechanical strength. However, the amorphous boron nitride layer a-BN has good mechanical strength because the amorphous boron nitride layer a-BN is not porous as shown in FIGS. 3A to 3D described above. At least one pore may be formed in the amorphous boron nitride layer a-BN. Pores may be formed in the amorphous boron nitride layer a-BN, and thus the dielectric constant may be further lowered. In some cases, other materials may be filled in the pores of the amorphous boron nitride layer a-BN. Even if the pores of the amorphous boron nitride layer a-BN are filled with other materials, the utilization of the amorphous boron nitride layer a-BN may increase without significantly increasing the dielectric constant.

Figure 11:
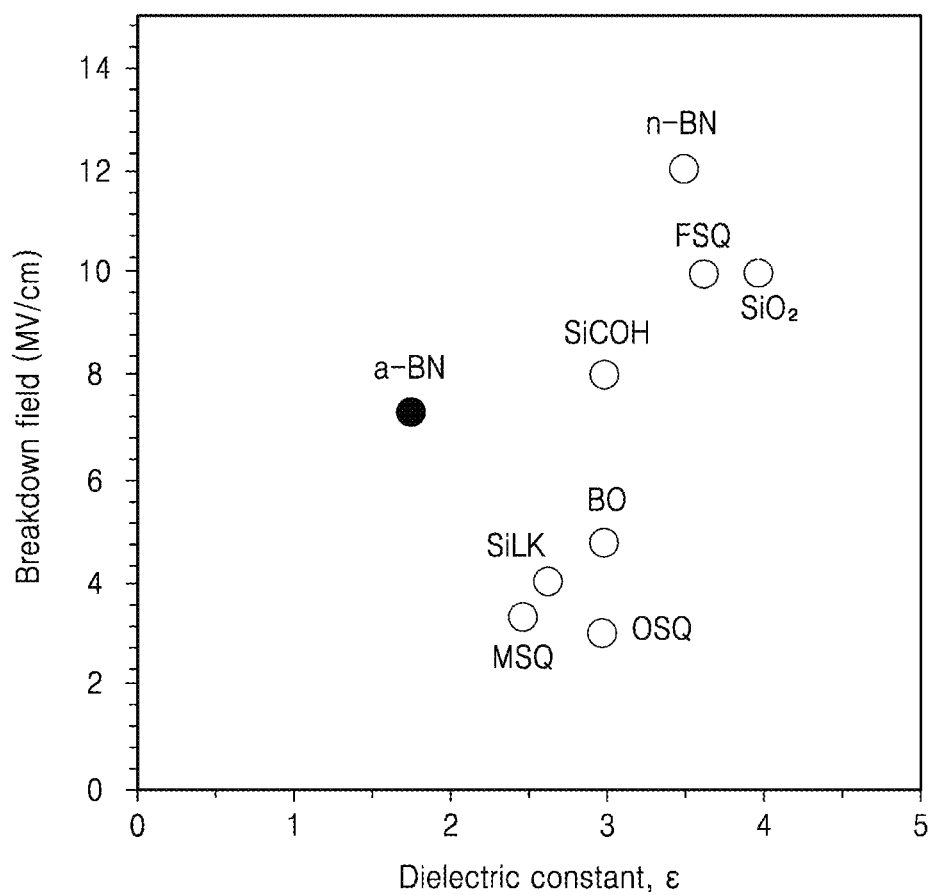
FIG. 11 is a graph showing the relationship between dielectric constants and breakdown fields of various materials.

FIG. 11 is a graph showing the relationship between dielectric constants and breakdown fields of various materials. As shown in FIG. 11, it may be confirmed that the dielectric constants and the breakdown fields are in a proportional relationship. As shown in FIG. 11, it may be confirmed that the breakdown field of the amorphous boron nitride layer a-BN is higher than that of other materials having a dielectric constant close to 2.

FIG. 12 is a table summarizing the properties of the amorphous boron nitride layer a-BN and a hexagonal boron nitride layer according to an embodiment. As indicated in FIG. 12, it may be confirmed that the amorphous boron nitride layer a-BN BN has a dielectric constant of 2 or less at an operating frequency of 100 kHz or less. In addition, the breakdown field of the amorphous boron nitride layer a-BN is 7.3 MV-cm$^{-1}$, which is much larger than that of the hexagonal boron nitride layer, and the reflection index for electromagnetic waves of 633 nm is also 2 or less.

The amorphous boron nitride layer a-BN may be used as an interlayer insulating layer because of the electrical and dielectric properties as described above. In particular, when the amorphous boron nitride layer a-BN is used as the interlayer insulating layer between conductive materials, parasitic capacitance may be reduced.

In addition, since the amorphous boron nitride layer a-BN is chemically stable, the amorphous boron nitride layer a-BN may be used as a diffusion barrier.

For example, a key step in back end of line (BEOL) CMOS fabrication of logic and memory devices is the deposition of the diffusion barrier between a low dielectric material and metal wire interconnects to prevent metal atom migration into an insulator. Ideally, if the low dielectric material may also serve as the diffusion barrier, it may be unnecessary to deposit a separate diffusion barrier. The amorphous boron nitride layer a-BN according to an embodiment may be used as the diffusion barrier because of its low dielectric constant and large breakdown field.

Figure 13:
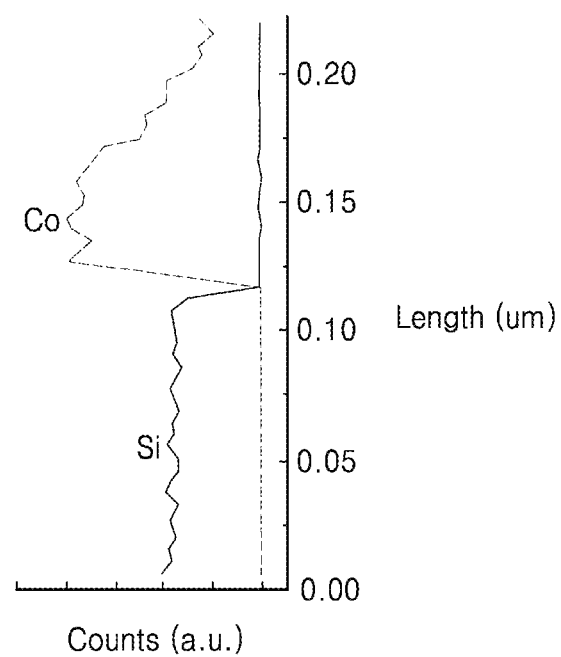
FIG. 13 is an energy dispersive spectroscopy (EDS) line profile after a thermal diffusion test for an amorphous boron nitride layer according to an embodiment.

FIG. 13 is an energy dispersive spectroscopy (EDS) line profile after a thermal diffusion test for the amorphous boron nitride layer a-BN according to an embodiment. The amorphous boron nitride layer a-BN having a thickness of 3 nm was formed on a Si substrate and a cobalt layer of 80 nm was deposited on the amorphous boron nitride layer a-BN according to an embodiment. The diffusion barrier properties of the amorphous boron nitride layer a-BN were tested by annealing Co/a-BN/Si devices in vacuum for 1 hour at 600° C.

As shown in FIG. 13, it may be confirmed that a cobalt component and a silicon component are separated according to the height of the thickness. This means that the cobalt component does not diffuse into a silicon region. It may be seen that the amorphous boron nitride layer a-BN serves as a diffusion barrier.

Figure 14I:
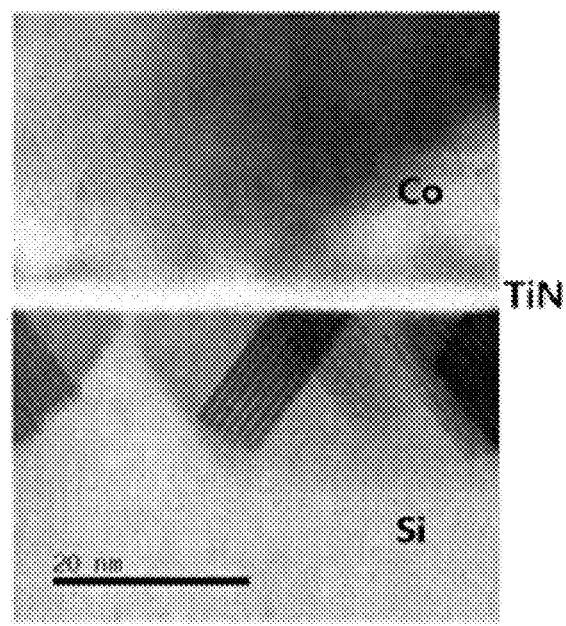
FIG. 14($i$) is a cross-sectional transmission electron microscope (TEM) image and FIG. 14($ii$) an EDS line profile after a heat diffusion test for a TiN layer as a comparative example.
Figure 14:
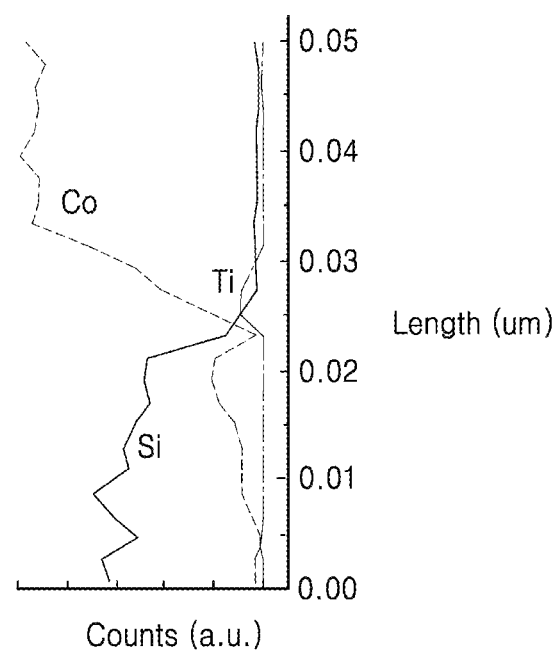

FIG. 14(*i*) is a cross-sectional TEM image and FIG. 14(*ii*) is an EDS line profile after a heat diffusion test for a TiN layer as a comparative example. The TiN layer of a thickness of 3 nm was formed on a silicon substrate, and a cobalt layer of 80 nm was deposited on the TiN layer. Then, Co/TiN/Si devices were annealed at 600° C. in vacuum for about 1 hour. As a result, as shown in FIG. 14(*i*) and FIG. 14(*ii*), it may be confirmed that cobalt was separated from the cobalt layer, and the separated cobalt was diffused to the silicon substrate.

It may be seen from the results of FIGS. 13, 14(*i*), 14(*ii*) that the amorphous boron nitride layer a-BN has a greater effect of preventing the diffusion of metal than the TiN layer which is generally used as a diffusion barrier.

Figure 15:
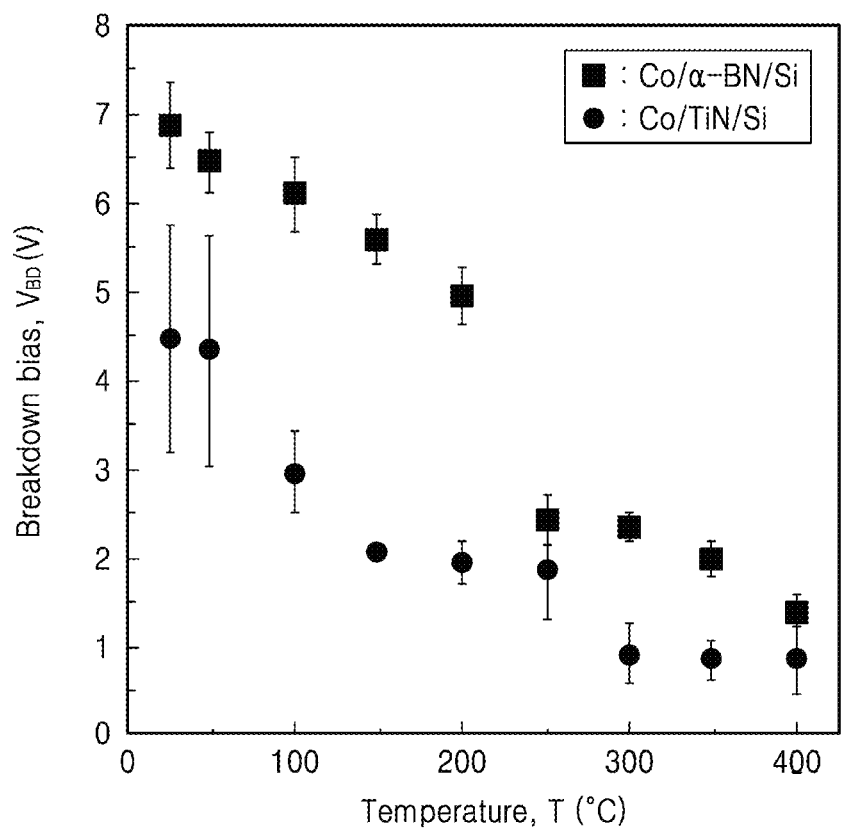
FIG. 15 is a result showing a breakdown bias according to the temperature of an amorphous boron nitride layer according to an embodiment.

FIG. 15 is a result showing a breakdown bias according to the temperature of the amorphous boron nitride layer a-BN according to an embodiment. It may be seen that the breakdown bias of the amorphous boron nitride layer a-BN is inversely proportional to the temperature. Although the breakdown voltage decreases as the temperature increases, it may be seen that the breakdown bias of the amorphous boron nitride layer a-BN is larger than the breakdown bias of a TiN layer. This means that the amorphous boron nitride layer a-BN is stable at various temperatures, and as a result, the amorphous boron nitride layer a-BN may be an excellent low-k material for high-performance CMOS electronic devices.

The boron nitride layer formed by using an inductively coupled plasma-chemical vapor deposition (ICP-CVD) method at a low temperature of 400° C. or less is amorphous and may perform a diffusion barrier function. In addition, the amorphous boron nitride layer a-BN has a low dielectric constant and has a large breakdown field compared to a material having a similar dielectric constant. The amorphous boron nitride layer a-BN is fabricated at a low temperature of 400° C. or less, and a process temperature may be adjusted depending on a substrate, pressure, etc. For example, when the substrate serves as a catalyst for forming the boron nitride layer, boron nitride layer may be formed at a temperature lower than 400° C., for example, 300° C.

A boron nitride layer formed at a temperature higher than 400° C. will be described below. For example, the boron nitride layer was grown on a silicon substrate by using the ICP-CVD method at a process pressure of about 10$^{-4}$ Torr and a process temperature of about 700° C.

Figure 16A:
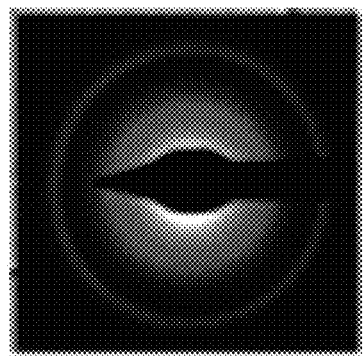
FIG. 16A is an image of selective area electron diffraction of a boron nitride layer grown at about 700° C. according to an embodiment.
Figure 16B:
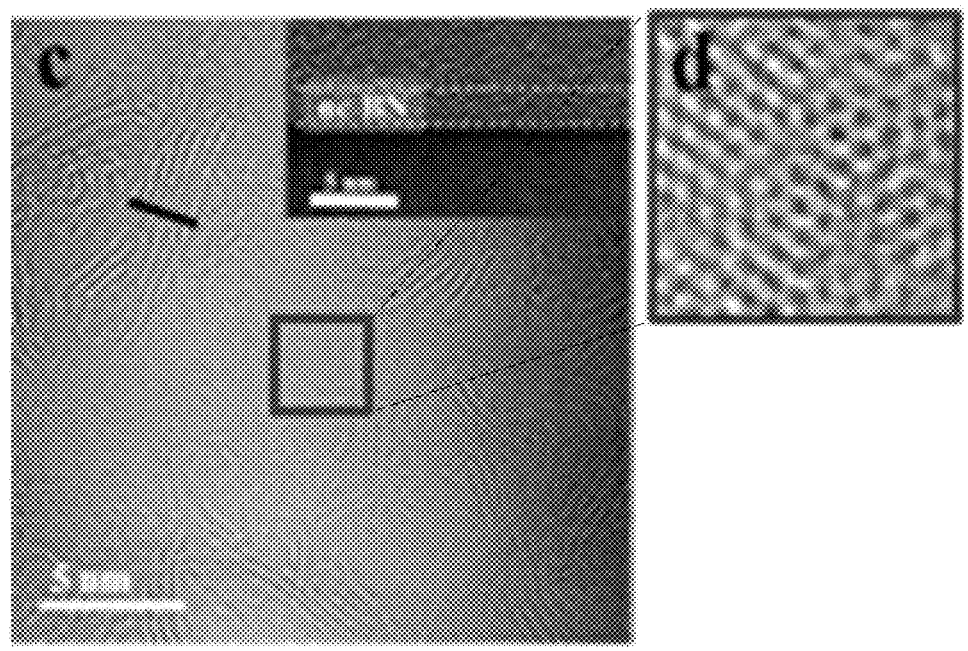
FIG. 16B is a high magnification TEM image of a boron nitride layer grown at about 700° C. according to an embodiment.
Figure 16C:
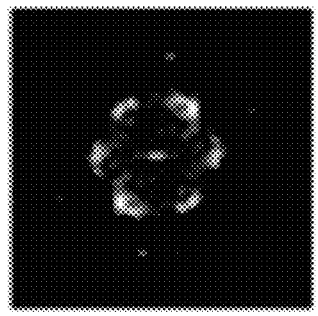
FIG. 16C shows a fast Fourier transform result for a boron nitride layer grown at about 700° C. according to an embodiment.

FIGS. 16A to 16C are diagrams showing an atomic structure of a boron nitride layer grown at about 700° C. according to an embodiment. FIG. 16A is an image of the selective area electron diffraction of the boron nitride layer grown at about 700° C. The image of FIG. 16A shows a polycrystalline ring pattern. FIG. 16B is a high magnification TEM image of the boron nitride layer grown at about 700° C. wherein it may be confirmed that nano-sized small crystallites are arranged. In addition, FIG. 16C is a diagram showing a fast Fourier transform result for the boron nitride layer grown at about 700° C. wherein it may be confirmed that the boron nitride layer has a hexagonal superstructure. Therefore, it may be confirmed that the boron nitride layer grown at a temperature higher than about 400° C., for example, 700° C., includes nano-sized crystallites.

A nanocrystalline boron nitride layer nc-BN has good mechanical strength because the nanocrystalline boron nitride layer nc-BN is not porous, as shown in FIGS. 3A to 3D described above. One or more pore may be formed in the nanocrystalline boron nitride layer nc-BN according to an apparatus to which the nanocrystalline boron nitride layer nc-BN is applied. Pores may be formed in the nanocrystalline boron nitride layer nc-BN, and thus a dielectric constant may be further lowered. According to embodiments, other materials may be filled in the pores of the nanocrystalline boron nitride layer nc-BN. Even if the pores of the nanocrystalline boron nitride layer nc-BN are filled with other materials, the utilization of the nanocrystalline boron nitride layer nc-BN may increase without significantly increasing the dielectric constant.

Figure 17:
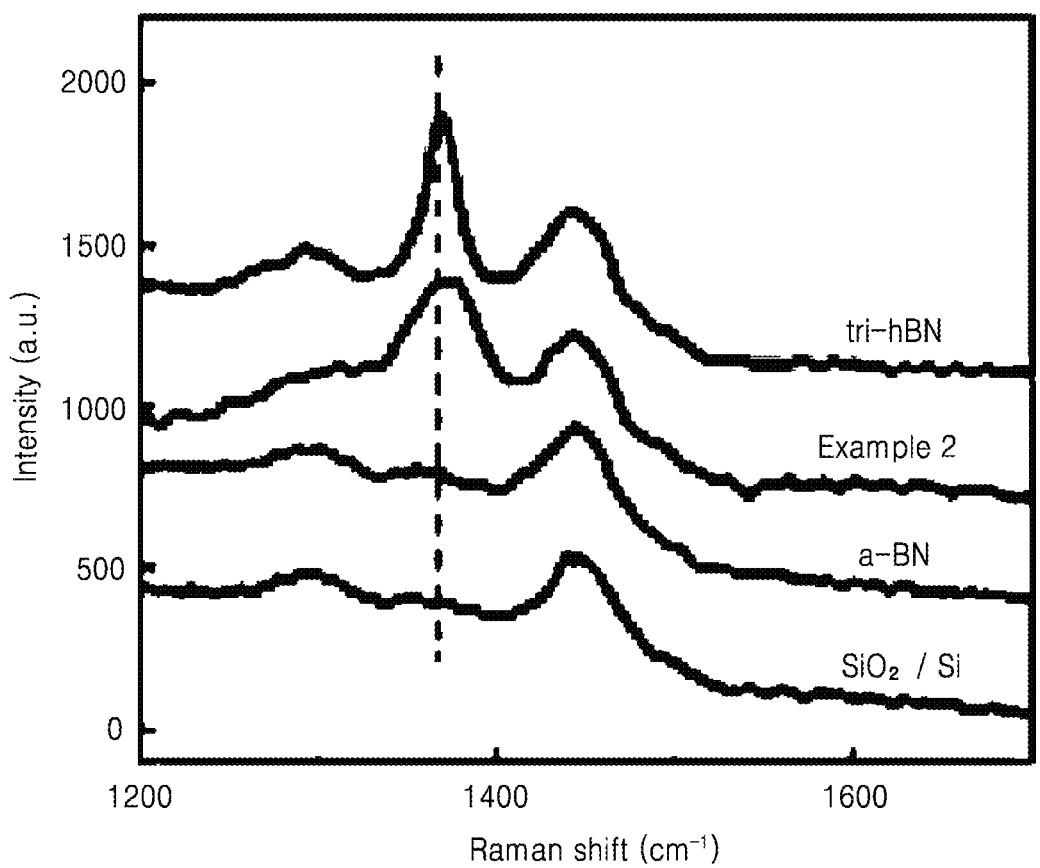
FIG. 17 is a Raman spectrum result with regard to a nanocrystalline boron nitride layer according to an embodiment.

FIG. 17 is a Raman spectrum result of the nanocrystalline boron nitride layer nc-BN according to an embodiment. As shown in FIG. 17, it may be confirmed that a peak is not present at a wavelength of about 1370 $cm^{-1}$ in a substrate including $SiO_2$/Si and the amorphous boron nitride layer a-BN, whereas a peak is present in Example 2 which is a boron nitride layer formed at 700° C. and the hexagonal boron nitride layer Tri-hBN at the wavelength of about 1370 $cm^{-1}$. It may be seen that the boron nitride layer formed at 700° C. has crystallinity. Hereinafter, the boron nitride layer having nano-sized crystallites is referred to as the nanocrystalline boron nitride layer nc-BN.

Figure 18:
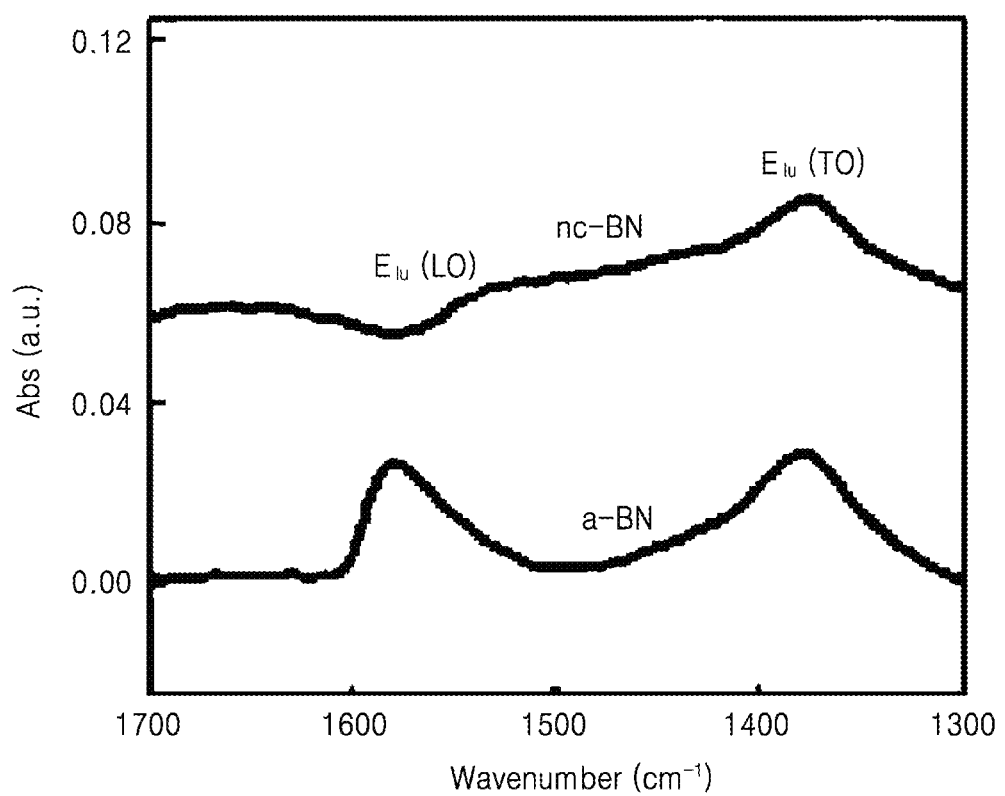
FIG. 18 shows a FTIR spectrum result with regard to a nanocrystalline boron nitride layer according to an embodiment

FIG. 18 shows a FTIR spectrum result of the nanocrystalline boron nitride layer nc-BN according to an embodiment. FTIR spectrum of the boron nitride layer is measured using s-polarised radiation at an incident angle of 60°. As shown in FIG. 18, it may be confirmed in the nanocrystalline boron nitride layer nc-BN that there is an absorption peak near 1370 $cm^{-1}$ that is attributed to a transverse optical mode, whereas there is no absorption peak near 1570 $cm^{-1}$. This means that the nanocrystalline boron nitride layer nc-BN according to an embodiment does not have amorphous properties.

Figure 19:
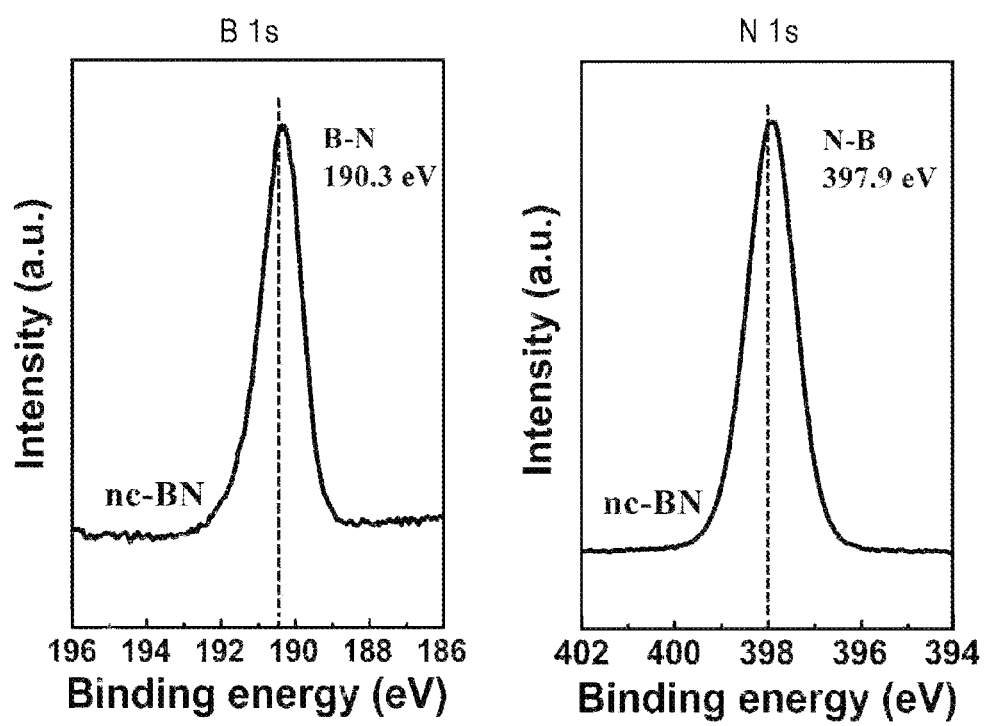
FIG. 19 is a diagram illustrating an XPS profile result with regard to a nanocrystalline boron nitride layer according to an embodiment.

FIG. 19 is a diagram illustrating an XPS profile result of the nanocrystalline boron nitride layer nc-BN according to an embodiment. As shown in FIG. 19, it may be confirmed that peaks of 1 s of boron and 1 s of nitrogen are 190.4 eV and 397.9 eV, respectively. It may be confirmed that the peaks of 1 s of boron and 1 s of nitrogen of the nanocrystalline boron nitride layer nc-BN and the amorphous boron nitride layer a-BN are almost identical. It may be confirmed from the XPS profile of FIG. 19 that the atom ratio of boron and nitrogen is about 1:1.08.

Figure 20:
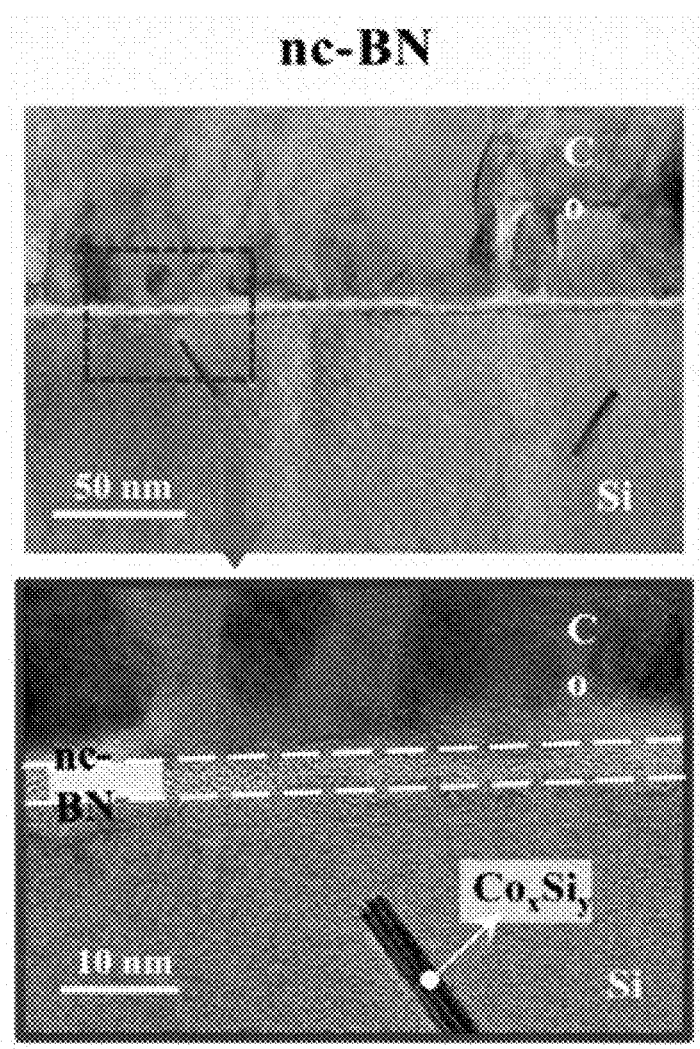
FIG. 20 is a diagram illustrating an example of using a nanocrystalline boron nitride layer as a diffusion barrier layer according to an embodiment.

FIG. 20 is a diagram illustrating an example in which the nanocrystalline boron nitride layer nc-BN is used as a diffusion barrier layer according to an embodiment. A boron nitride layer was grown on a silicon substrate at 700° C., and a cobalt layer of a thickness of 50 nm was deposited on the boron nitride layer. The boron nitride layer grown at 700° C. may be the nanocrystalline boron nitride layer nc-BN. Thereafter, the above-described structure was vacuum annealed at 600° C. for 1 hour. As shown in FIG. 20, a needle-shaped cobalt silicide of a very low density was observed on the silicon substrate. It may be confirmed that the nanocrystalline boron nitride layer nc-BN performed a function of a diffusion barrier even in an annealing condition.

Figure 21:
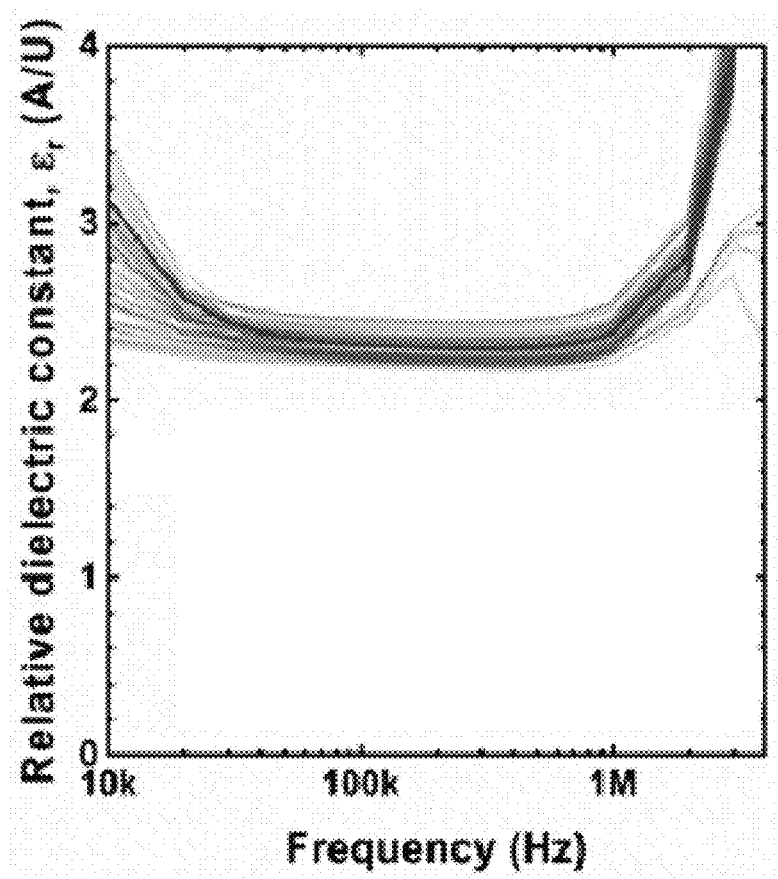
FIG. 21 is a graph showing a dielectric constant of a nanocrystalline boron nitride layer for each frequency according to an embodiment.

FIG. 21 is a graph showing a dielectric constant of the nanocrystalline boron nitride layer nc-BN for each frequency according to an embodiment. As shown in FIG. 21, it may be confirmed that in the operating frequency range of about 50 kHz to about 1 MHz, the nanocrystalline boron nitride layer nc-BN has a dielectric constant of 2.5 or less. For example, it may be confirmed that the nanocrystalline boron nitride layer nc-BN has a dielectric constant of about 2.3 to about 2.5. It may be confirmed that a crystalline hexagonal boron nitride generally has a dielectric constant of about 2.9 to about 3.8 in the operating frequency range of about 50 MHz to about 100 kHz, whereas the nanocrystalline boron nitride layer nc-BN has a low dielectric constant of 2.5 or less. As described above, the nanocrystalline boron nitride layer nc-BN may be used as an interlayer insulating layer because of its low dielectric constant. In particular, when the nanocrystalline boron nitride layer nc-BN is used as the interlayer insulating layer between conductive materials, parasitic capacitance may be reduced.

Even if the amorphous boron nitride layer a-BN itself is not porous, pores may be formed in the amorphous boron nitride layer a-BN depending on an apparatus to which the amorphous boron nitride layer a-BN is applied. Pores may be formed in the amorphous boron nitride layer a-BN, and thus the dielectric constant may be further lowered.

The amorphous boron nitride layer a-BN may have an energy band gap of about 6.00 eV or less. In general, it may be confirmed that a three-layer hexagonal boron nitride layer has an energy band gap of about 6.05 eV, while a boron nitride layer grown at 400° C. has an energy band gap of about 5.96 eV, and a boron nitride layer grown at 700° C. has an energy band gap of about 5.85 eV. That is, the amorphous boron nitride layer a-BN and/or the nanocrystalline boron nitride layer nc-BN has a lower energy band gap than the hexagonal boron nitride layer. Therefore, the amorphous boron nitride layer a-BN and/or the nanocrystalline boron nitride layer nc-BN is chemically stable.

Figure 22A:
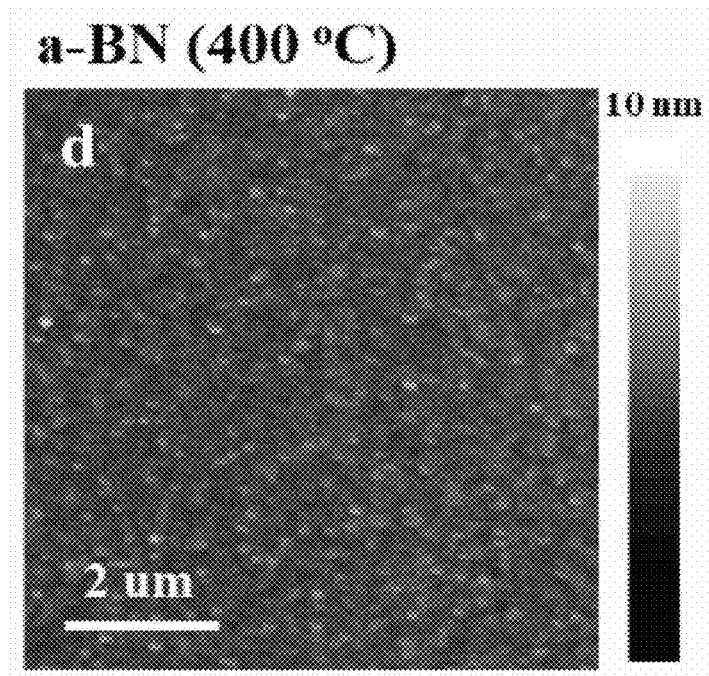
FIG. 22A is an atomic force microscope (AFM) image of a boron nitride layer grown at about 400° C.
Figure 22B:
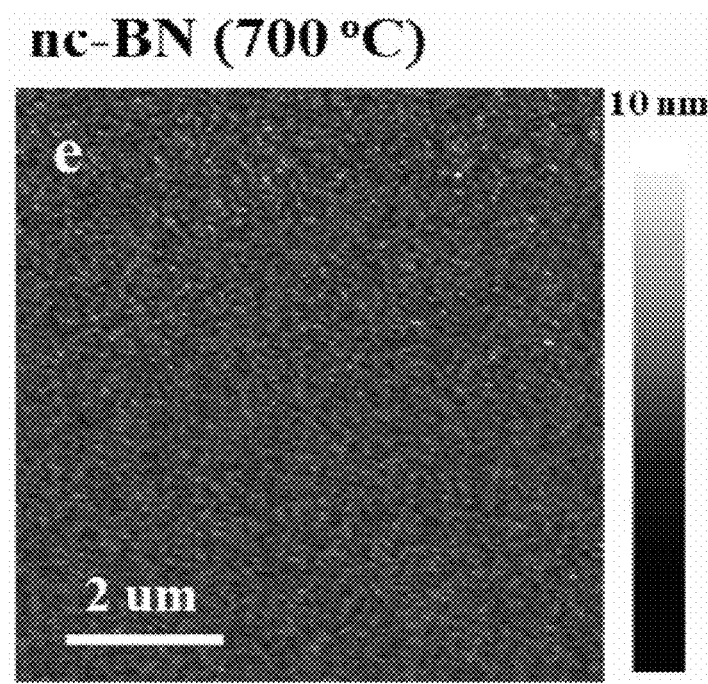
FIG. 22B is an AFM image of a boron nitride layer grown at about 700° C.

FIG. 22A is an atomic force microscope (AFM) image of the boron nitride layer BN grown at about 400° C., and FIG. 22B is an AFM image of a boron nitride layer grown at about 700° C. As shown in FIG. 22A, it was confirmed that the surface roughness of the boron nitride layer BN grown at about 400° C. is about 0.45 nm, and as shown in FIG. 22B, the surface roughness of the boron nitride layer grown at about 700° C. is about 0.39 nm. Because the surface of the amorphous boron nitride layer a-BN is smooth, it is easy to form another layer on the boron nitride layer BN, thereby facilitating manufacturing of an apparatus.

Figure 23:
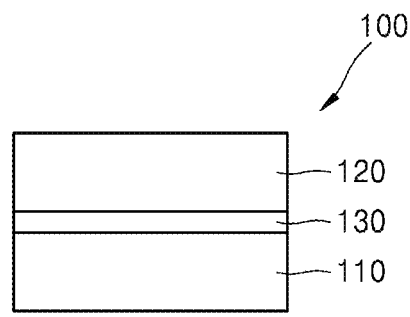
FIG. 23 is a diagram illustrating a multilayer structure including a diffusion barrier layer according to an embodiment.

FIG. 23 is a diagram illustrating a multilayer structure 100 including a diffusion barrier layer according to an embodiment. As shown in FIG. 23, the multilayer structure 100 may include a first material layer 110, a second material layer 120 apart from the first material layer 110, and the diffusion barrier layer 130 between the first material layer 110 and the second material layer 120.

The first material layer 110 and the second material layer 220 may include different materials. The diffusion barrier layer 130 may suppress or prevent the movement (diffusion) of materials (atoms) between the first material layer 110 and the second material layer 120. The diffusion barrier layer 130 may include at least one of the amorphous boron nitride layer a-BN and the nanocrystalline boron nitride layer nc-BN described above. In addition, the diffusion barrier layer 130 may further include a material other than the amorphous boron nitride layer a-BN and the nanocrystalline boron nitride layer nc-BN. For example, the diffusion barrier layer 130 may include a metal chalcogenide-based material having a two-dimensional crystal structure and graphene. Alternatively, the diffusion barrier layer 130 may include Ti, Ta, TiN, TaN, TiSiN, WC, Co, MnN, Mn, and metal silicide, etc. One of the first and second material layers 110 and 220 of FIG. 23 may be a conductive material, and the other may be a semiconductor material. Alternatively, one of the first and second material layers 110 and 120 may be a conductive material, and the other may be an insulating material.

For example, the first material layer 110 may be an insulating layer and the second material layer 120 may be a conductive layer. The first material layer 110 may be an insulating layer including silicon oxide, silicon nitride, silicon nitride, etc., or including a high dielectric material having a dielectric constant higher than that of silicon nitride. Alternatively, the first material layer 110 may include a SiCOH-based organic-inorganic hybrid organic insulating material. Any insulating material used for general electronic devices or semiconductor devices may be applied to the first material layer 110. The second material layer 120 may be a metal layer or a metal compound layer. In this case, the diffusion barrier layer 130 may suppress/prevent the movement/diffusion of the material of the second material layer 120, for example, metal atoms, to the first material layer 110.

Figure 24:
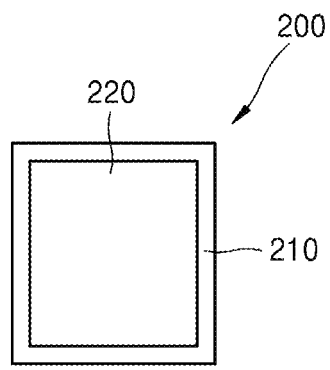
FIG. 24 is a cross-sectional view illustrating a multilayer structure including a diffusion barrier layer according to another embodiment.

FIG. 24 is a cross-sectional view illustrating a multilayer structure 200 including a diffusion barrier layer 210 according to another embodiment.

Referring to FIG. 24, the diffusion barrier layer 210 may be provided to cover at least one surface of a conductive layer 220. For example, the diffusion barrier layer 210 may be provided to cover the entire side surface of the conductive layer 220. The conductive layer 220 may be a layer including a metal or a metal compound. The diffusion barrier layer 210 may further include a material other than the amorphous boron nitride layer a-BN and the nanocrystalline boron nitride layer nc-BN. Although not shown, another material layer bonded to the conductive layer 220 may be further provided with the diffusion barrier layer 210 therebetween. The other material layer may be a semiconductor layer or an insulating layer. In addition, a desired and/or alternatively predetermined adhesive layer may be further provided between the diffusion barrier layer 210 and the conductive layer 220. Although not shown, the diffusion barrier layer 210 may be provided to surround the entire side surface of a conductive material layer.

Figure 25:
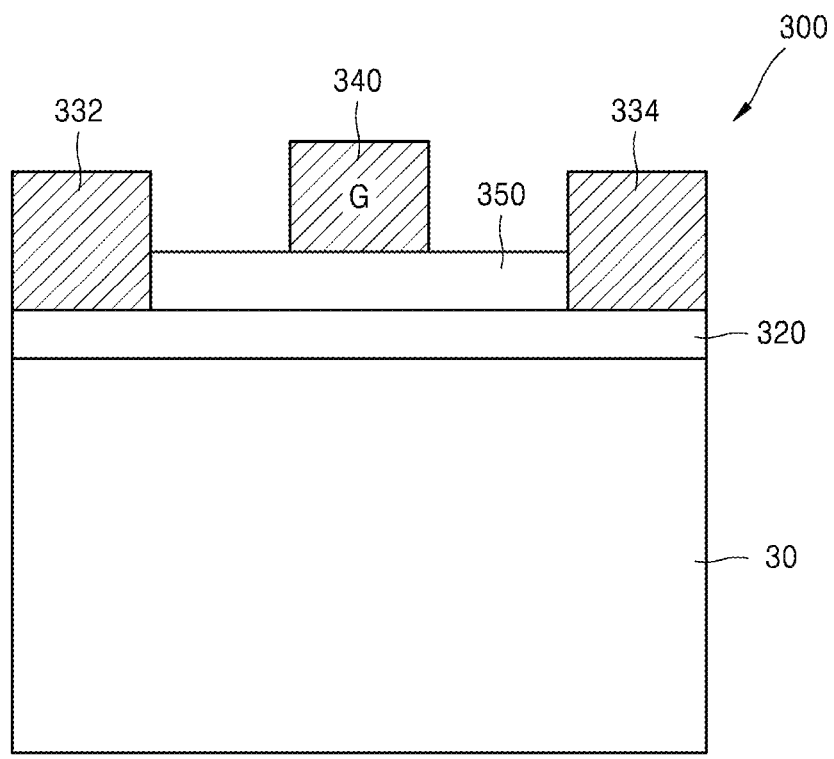
FIG. 25 is a reference diagram illustrating a transistor including a boron nitride layer according to an embodiment.

FIG. 25 is a reference diagram illustrating a transistor 300 including a boron nitride layer according to an embodiment.

Referring to FIG. 25, the transistor 300 may include a substrate 310, a channel 320 provided on the substrate 310, a source 332 and a drain 334 provided to apply a voltage to the channel 320 and spaced apart from each other, a gate 340 provided to form an electric field on the channel 320, and a gate insulating layer 350 provided between the channel 320 and the gate 340.

The substrate 310 may include a material such as silicon (Si), silicon-germanium, silicon carbide (SiC), glass, plastic, etc. In addition, the substrate 310 may include an epitaxial layer, a silicon-on-insulator (SOI) layer, a semiconductor-on-insulator (SEO) layer, etc.

The channel 320 may be selected and formed as a suitable semiconductor according to a product design. For example, the channel 320 may be an oxide semiconductor, an organic semiconductor, amorphous silicon, poly-silicon, etc. For example, the oxide semiconductor may include zinc oxide (ZnO) or InZnO (IZO), InGaZnO (IGZO), HfInZnO (HIZO), etc. doped with zinc oxide (ZnO) and indium (In), gallium (Ga), hafnium (Hf), tin (Sn), etc.

The source 332 and the drain 334 may be electrically connected through the channel 320. The source 332 and the drain 334 may include a conductive material. For example, the source 332 and the drain 334 may include a metal, a metal alloy, a conductive metal oxide, a conductive metal nitride, etc. The source 332 and the drain 334 may be formed in a single layer or a multilayer structure.

The gate 340 may include a material having conductivity, and include a metal, a metal alloy, a conductive metal oxide, a conductive metal nitride, etc. In addition, the gate 340 may include a semiconductor material doped with impurities.

The gate insulating layer 350 may be formed between the gate 340 and the channel 320. The gate insulating layer 350 may include the amorphous boron nitride layer a-BN or the nanocrystalline boron nitride layer nc-BN according to an embodiment.

The amorphous boron nitride layer a-BN or the nanocrystalline boron nitride layer nc-BN according to an embodiment may be used as one component of an interconnect structure. The processing and structures of the interconnect structure may be applied to front-end-of-line (FEOL) semiconductor processing and structures, back end of line (BEOL) semiconductor processing and structures, or both.

FEOL is part of integrated circuit (IC) manufacturing where individual devices (e.g., transistors, capacitors, resistors, etc.) are patterned on a semiconductor substrate or a layer. FEOL generally covers everything up to, (but not including), the deposition of metal interconnect layers. After the final FEOL operation, the result may typically be a wafer with isolated transistors (e.g., without any wires).

BEOL is a second part of IC manufacturing where individual devices (e.g., transistors, capacitors, resistors, etc.) are interconnected with wire on the wafer, e.g., a metallization layer or layers. BEOL may include contacts, insulating layers (dielectrics), metal levels, and bonding sites for chip-to-package connections. In the BEOL part of the manufacturing stage contacts (pads), interconnect wires, vias and dielectric structures may be formed. In recent IC processes, more than 10 metal layers may be added in BEOL.

Figure 26:
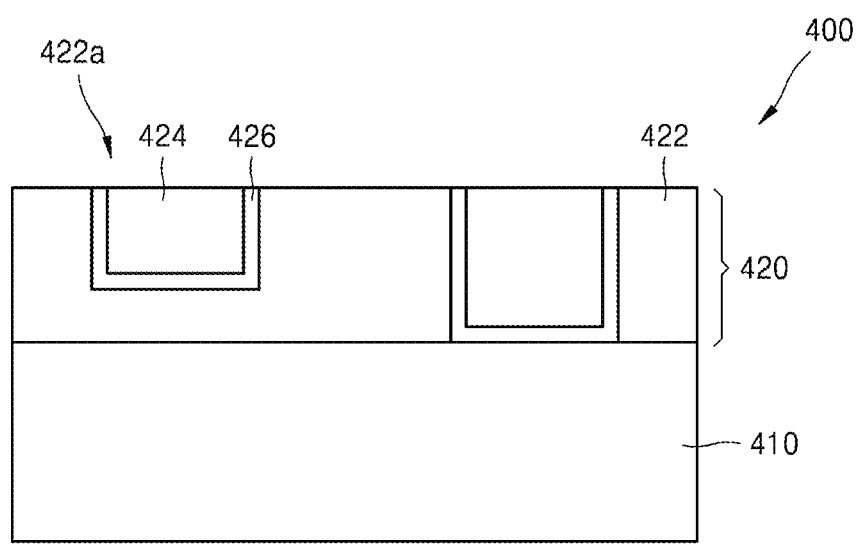
FIG. 26 is a reference diagram illustrating a semiconductor apparatus including an interconnect structure according to an embodiment.

FIG. 26 is a reference diagram illustrating a semiconductor apparatus 400 including an interconnect structure 420 according to an embodiment.

Referring to FIG. 26, the semiconductor apparatus 400 may include a substrate 410 and the interconnect structure 420 provided on the substrate 410. Here, the interconnect structure 420 may include a dielectric layer 422, a conductive wire 424, and a diffusion barrier layer 426.

The substrate 410 may be a semiconductor substrate. For example, the substrate 410 may include a Group IV semiconductor material, a Group III/V semiconductor compound, or a Group II/VI semiconductor compound. As a specific example, the substrate 410 may include Si, Ge, SiC, SiGe, SiGeC, Ge Alloy, GaAs, InAs, InP, etc. However, this is merely an example and various other semiconductor materials may be used as the substrate 410.

The substrate 410 may include a single layer or a plurality of layers in which different materials are stacked. The substrate 410 may include, for example, a silicon-on-insulator (SOI) substrate or a silicon germanium-on-insulator (SGOI) substrate. In addition, the substrate 410 may include a non-doped semiconductor material or a doped semiconductor material.

The substrate 410 may include at least one semiconductor device (not shown). The semiconductor device may include, for example, at least one of a transistor, a capacitor, a diode, and a resistor. However, the semiconductor device is not limited thereto.

The dielectric layer 422 may be formed on the substrate 410. The dielectric layer 422 may have a single layer structure or a multilayer structure in which different materials are stacked. The dielectric layer 422 may include a dielectric material used in a general semiconductor manufacturing process. For example, the dielectric layer 422 may include silicon oxide, nitride, silicon nitride, silicon carbide, silicate, etc. However, this is merely an example and other various dielectric materials may be used as the dielectric layer 422. In addition, the dielectric layer 422 may include a SiCOH-based organic/inorganic hybrid dielectric material. Further, the dielectric layer 422 may include at least one of the amorphous boron nitride layer a-BN and the nanocrystalline boron nitride layer nc-BN. When the dielectric layer 422 includes at least one of the amorphous boron nitride layer a-BN and the nanocrystalline boron nitride layer nc-BN, because the dielectric layer 422 may also perform a function of the diffusion barrier layer 426 described later, the diffusion barrier layer 426 may not be provided separately.

At least one trench 422a may be formed in the dielectric layer 422 at a desired and/or alternatively predetermined depth. Here, the at least one trench 422a may be formed not to be in contact with the substrate 110 or may be formed to be in contact with the substrate 410. In FIG. 26, two trenches 522a are formed in the dielectric layer 422 in which the trench 422a is not in contact with the substrate 410 and the trench 422a is in contact with the substrate 410.

The conductive wire 424 may be provided to fill the inside of the trench 422a. The conductive wire 424 may include a metal or a metal alloy having excellent electrical conductivity. For example, the conductive wire 424 may include Cu, Ru, Al, Co, W, Mo, Ti, Ta, Ni, Pt, Cr, Rh, Ir or an alloy thereof. However, the conductive wire 424 is not limited thereto, and various other metals may be used as the conductive wire 424.

The diffusion barrier layer 426 may be provided on the inner wall of the trench 422a. Here, the diffusion barrier layer 426 may be provided to cover the conductive wire 424 between the dielectric layer 422 and the conductive wire 424 Specifically, the diffusion barrier layer 426 may be provided on the inner wall of the trench 422a to cover side and lower surfaces of the conductive wire 424. An upper surface of the conductive wire 424 may be exposed by the diffusion barrier layer 426. The diffusion barrier layer 426 may prevent diffusion of a material forming the conductive wire 424. In addition, the diffusion barrier layer 426 may additionally serve as an adhesive layer between the dielectric layer 422 and the conductive wire 424. The diffusion barrier layer 426 may include at least one of the amorphous boron nitride layer a-BN and the nanocrystalline boron nitride layer nc-BN according to an embodiment.

In addition, the amorphous boron nitride layer a-BN and the nanocrystalline boron nitride layer nc-BN may be used as a diffusion barrier layer in various electronic apparatuses. The boron nitride layer may grow directly on an electronic apparatus or boron nitride layer may grow on a base substrate and may be transferred to the electronic apparatus.

The amorphous boron nitride layer a-BN and the nanocrystalline boron nitride layer nc-BN may grow directly on some components of the electronic apparatus because the amorphous boron nitride layer a-BN and the nanocrystalline boron nitride layer nc-BN grow at a low temperature. In addition, since the surface roughness of the boron nitride layer is low, other components of the electronic apparatus may be directly stacked on the boron nitride layer BN, which is grown.

In addition, the movement (diffusion) of materials (or atoms) between two material layers is suppressed or excellent in performance, and thus the boron nitride layer may perform the function of a diffusion barrier layer even at a thin thickness, for example, a thickness of 5 nm or less. Thus, a degree of integration of an integrated circuit (or a transistor) may increase.

Meanwhile, as semiconductor devices are integrated, parasitic capacitance is generated between the conductive material layers. The above-described parasitic capacitance has a problem of delaying signal transmission of semiconductor devices. An amorphous boron nitride layer or a nanocrystalline boron nitride layer according to an embodiment has a low dielectric constant, and thus the amorphous boron nitride layer or the nanocrystalline boron nitride layer is used as an interlayer insulating layer between conductive material layers to reduce parasitic capacitance. The thickness of the amorphous boron nitride layer and the nanocrystalline boron nitride layer used as the interlayer insulating layer may be about 5 nm or more.

In addition, the amorphous boron nitride layer or the nanocrystalline boron nitride layer enables a low temperature process and thus may be formed on the material layer of the electronic apparatus without damaging other materials of the electronic apparatus. In addition, since the amorphous boron nitride layer or the nanocrystalline boron nitride layer has a low surface roughness, other material layers may be sequentially stacked. The semiconductor devices described above may include transistors, resistors, capacitors, etc.

Figure 27:
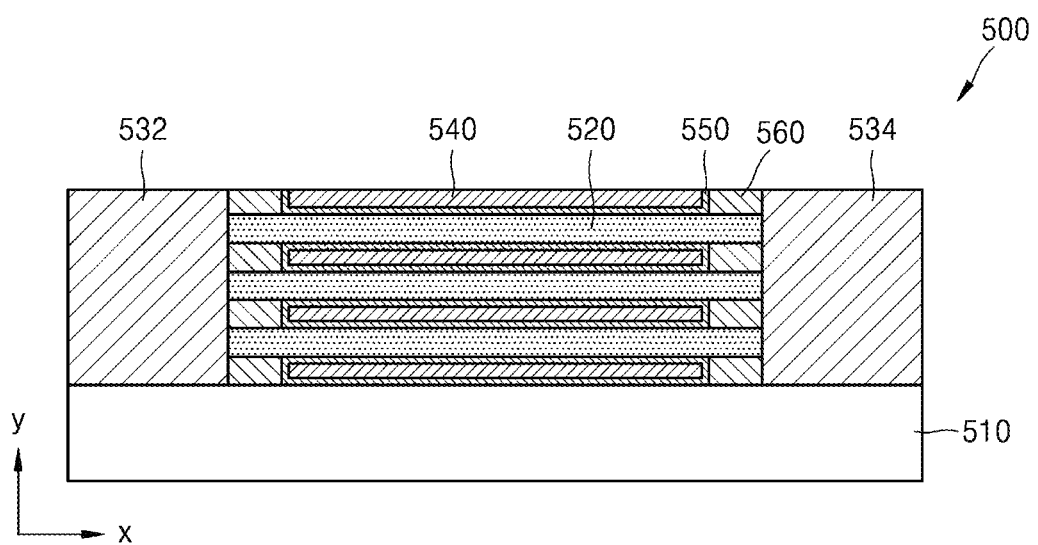
FIG. 27 is a diagram illustrating a field effect transistor including a boron nitride layer according to an embodiment.

FIG. 27 is a diagram illustrating a field effect transistor 500 including a boron nitride layer according to an embodiment. The field effect transistor 500 disclosed in FIG. 27 may include a plurality of channels 520 disposed on a substrate 510, a source 532 and a drain 534 contacting the channels 520, and a plurality of gates 540 spaced apart from the channels 520.

The substrate 510 may be an insulating substrate or a semiconductor substrate having an insulating layer formed on its surface. The semiconductor substrate may include, for example, Si, Ge, SiGe, or III-V semiconductor materials. The substrate 510 may be, for example, a silicon substrate having silicon oxide formed on its surface, but is not limited thereto.

On the substrate 510, the source 532 and the drain 534 may be spaced apart from each other along a first direction, and the plurality of channels 520 between the source 532 and the drain 534 may be spaced apart from each other along a second direction. The first direction may be an X direction, and the second direction may be a Y direction.

The plurality of gates 540 may be respectively spaced apart from the channels 520, and a gate insulating layer 550 may be disposed between the gates 540 and the channels 520. For example, the gate insulating layer 550 may be provided to surround at least a part of the gate 540. For example, the gate 540 and the channel 520 may be alternately arranged in the second direction, and the gate insulating layer 550 may be formed to surround the gate 540.

The gate insulating layer 550 may insulate between the channel 520 and the gate 540 and suppress leakage current.

The contact between each of the channels 520 and the source 532 and the drain 534 may have an edge contact form. For example, each end of the channel 520 is in contact with the source 532 and the drain 534.

Meanwhile, each of the gates 540 may be spaced apart from the source 532 and the drain 534, and a spacer 560 may be further provided between the gate 540 and the source 532 and between the gate 540 and the drain 534. Since the source 532, the gate 540 and the drain 534 are arranged in the first direction, parasitic capacitance may occur between the source 532 and the gate 540 and between the gate 540 and the drain 534.

To reduce parasitic capacitance, the spacer 560 according to an embodiment may include at least one of the amorphous boron nitride layer a-BN and the nanocrystalline boron nitride layer nc-BN. The above-described amorphous boron nitride layer a-BN and nanocrystalline boron nitride layer nc-BN have a dielectric constant of 2.5 or less at a frequency of 100 kHz, which may effectively reduce parasitic capacitance. The spacer 560 may further include a material having a low dielectric constant in addition to the boron nitride layer according to an embodiment.

In addition, the amorphous boron nitride layer a-BN and the nanocrystalline boron nitride layer nc-BN according to an embodiment do not have porosity and have mechanical strength, thereby supporting the channel 520 disposed on the upper layer of the spacer 560.

The field effect transistor 500 according to the embodiment may have a multi-bridge shape in which each of the plurality of channels 520 is stacked to be spaced apart along the direction away from the substrate 510, both ends of which are in contact with the source 532 and the drain 534. A channel of the multi-bridge shape may reduce a short channel effect and reduce an area occupied by a source/drain, and thus it is advantageous for high integration. In addition, since the channel may maintain a uniform source/drain junction capacitance regardless of a position of the channel, there is an advantage that it may be applied to a high-speed and high-reliability device.

The gate insulating layer 550 may include a high-k dielectric material, which is a high dielectric constant material. The gate insulating layer 550 may include, for example, aluminum oxide, hafnium oxide, zirconium hafnium oxide, lanthanum oxide, etc. However, the gate insulating layer 550 is not limited thereto.

The gate insulating layer 550 may include a ferroelectric material. When the gate insulating layer 550 includes the ferroelectric material, the field effect transistor 500 may be applied to, for example, a logic device or a memory device. When the gate insulating layer 550 includes the ferroelectric material, since a subthreshold swing (SS) may be lowered by a negative capacitance effect, performance may be improved while reducing the size of the field effect transistor 500.

Ferroelectric materials have a non-centrosymmetric charge distribution in a unit cell in a crystallized material structure, and thus have spontaneous electric dipoles, that is, spontaneous polarization. Thus, ferroelectric materials have remnant polarization by dipole even in the absence of an external electric field. In addition, the direction of polarization may be switched to a domain unit by the external electric field. The ferroelectric material may include, for example, at least one oxide selected from Hf, Si, Al, Zr, Y, La, Gd and Sr, but this is an example. In addition, the ferroelectric material may further include a dopant if necessary.

The gate insulating layer 550 may have a multilayer structure including the high-k material and the ferroelectric material. The gate insulating layer 550 may include a charge trapping layer, such as silicon nitride, such that the field effect transistor 500 may operate as a memory transistor having memory characteristics.

Figure 28:
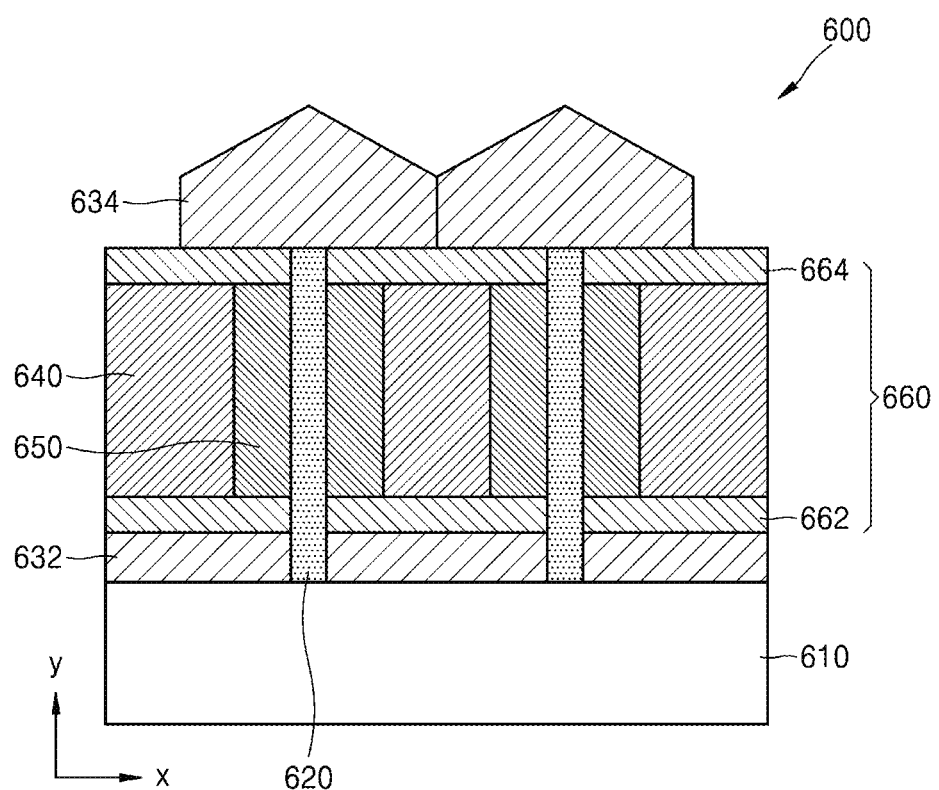
FIG. 28 is a diagram illustrating a vertical field effect transistor including a boron nitride layer according to an embodiment.

FIG. 28 is a diagram illustrating a vertical field effect transistor 600 including a boron nitride layer according to an embodiment. The field effect transistor 600 illustrated in FIG. 28 may be referred to as a vertical field effect transistor because current flows in a vertical direction through a channel 620 extending in the vertical direction from a substrate 610. The field effect transistor 600 of FIG. 28 may include the substrate 610, the channel 620, a source 632, a drain 634, a gate 640, a gate insulating layer 650, and a spacer 660.

The substrate 610 may include, for example, one or more semiconductor materials such as Si, Ge, SiGe, GaP, GaAs, SiC, SiGeC and/or InP. In some embodiments, the substrate 610 may be a bulk silicon substrate or a silicon on insulator (SOI) substrate.

The channels 620 may be spaced apart from each other in a first direction (e.g., an X-axis direction). The first direction may be parallel to the upper surface of the substrate 610. Each of the channels 620 may protrude from the upper surface of the substrate 610 in a second direction (e.g., a Y-axis direction). The second direction may be perpendicular to the top surface of the substrate 610. Forming the channel 620 may include forming a mask layer (not shown) on the substrate 610 and etching the substrate 610 using the mask layer as an etch mask to form the channel 620.

The source 632 may be disposed on substrate 610. The source 632 may come into contact while surrounding a part of the channel 620. The source 632 may be formed by performing an epitaxial growth process using the substrate 610 as a seed layer, and impurities may be added during the epitaxial growth process. However, the source 632 is not limited thereto. The source 632 may be formed by implanting impurities into the substrate 610. In addition, the source 632 may be disposed in contact with the side surface of the channel 620, but is not limited thereto, and may be disposed in contact with the lower surface of the channel 620.

A first spacer 662 may be disposed on the source 632, and the gate 640 and the gate insulating layer 650 may be disposed on the first spacer 662. The first spacer 662 may be provided to surround a part of the side surface of the channel 620, and the gate 640 may be disposed on the first spacer 662 while being spaced apart from the channel 620. The gate insulating layer 650 may be disposed on the first spacer 662 and between the gate 640 and the channel 620. The gate insulating layer 650 and the gate 640 may also extend vertically on the first spacer 662.

A second spacer 664 may be disposed on the gate 640 and the gate insulating layer 650, and the second spacer 664 may be provided to surround a part of the side surface of the channel 620.

In addition, a drain 634 may be formed on the channel 620. The drain 634 may be formed by the epitaxial growth process using the channel 620 as the seed layer. The drain 634 may be disposed to cover at least a part of the second spacer 664.

The first and second spacers 662 and 664 may include at least one of the amorphous boron nitride layer a-BN and the nanocrystalline boron nitride layer nc-BN according to an embodiment. The above-described amorphous boron nitride layer a-BN and nanocrystalline boron nitride layer nc-BN have low dielectric constants, and thus parasitic capacitance may be reduced. The first and second spacers 662 and 664 may further include a material having a low dielectric constant in addition to the boron nitride layer according to an embodiment.

In addition, the amorphous boron nitride layer a-BN and nanocrystalline boron nitride layer nc-BN according to an embodiment do not have porosity and have mechanical strength such that the first spacer 662 may support the gate 640 and the gate insulating layer 650, and the second spacer 664 may support the drain 634.

In addition, the first spacer 662 may be formed after forming the source 632, and the second spacer 664 may be formed after forming the gate 640 and the gate insulating layer 650. The first and second spacers 662 and 664 may be formed by forming the amorphous boron nitride layer a-BN and nanocrystalline boron nitride layer nc-BN at a low temperature and thus, the source 632 and the gate 640 may not be damaged.

In FIG. 28, the source 632 is formed on the lower side of the channel 620, and the drain 634 is formed on the upper side of the channel 620, but the source 632 and the drain 634 are not limited thereto. The drain 634 may be formed on the lower side of the channel 620 and the source 632 may be formed on the upper side of the channel 620.

Figure 29:
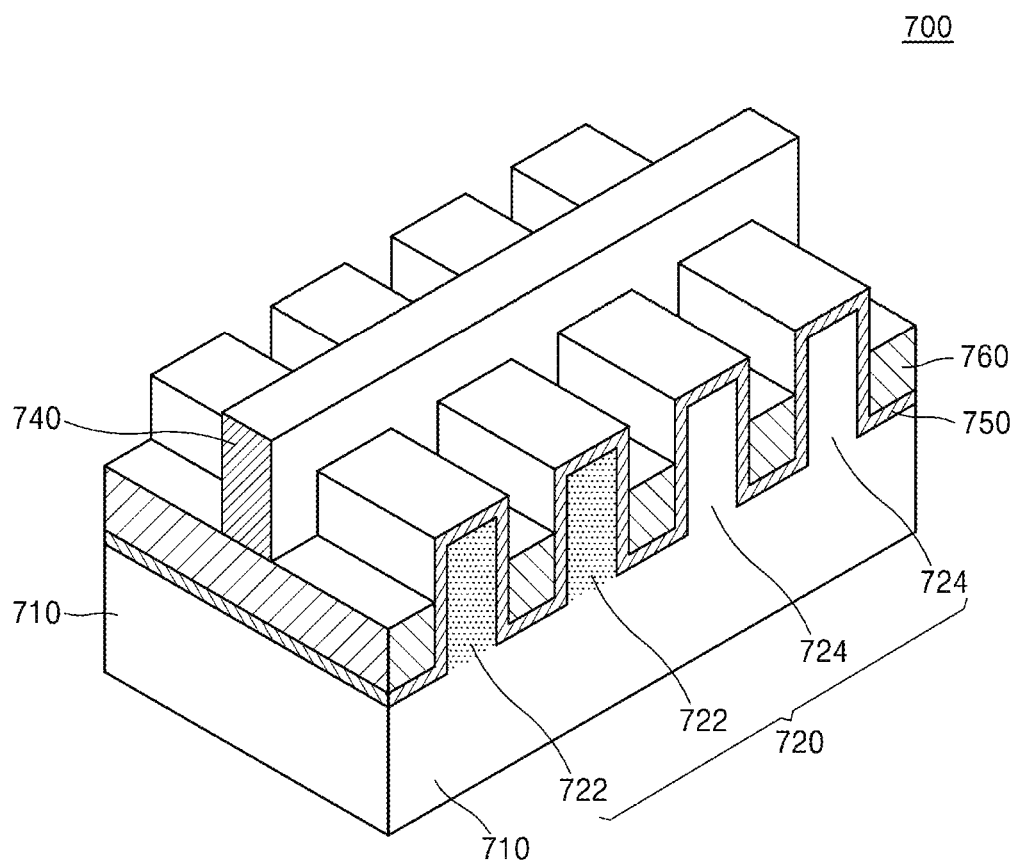
FIG. 29 is a diagram illustrating a fin type transistor including a boron nitride layer according to an embodiment.

FIG. 29 is a diagram illustrating a fin type transistor 700 including a boron nitride layer according to an embodiment. The fin type transistor 700 of FIG. 29 is a three-dimensional transistor having a fin structure protruding on a substrate 710. Since the fin type transistor 700 may use protruding fin structures 722 and 724 as channels 720, the channel length may be sufficiently secured. Accordingly, a short channel effect may be prevented or minimized, and generation of leakage current and area problems may be improved.

The transistor 700 may include the substrate 710, the active fin 722, the dummy fin 724, a gate 740, a gate insulating layer 750 and a spacer 760. Although not shown in the figure, each end of the active fin 722 is electrically connected to a source and a drain. Although a second active fin is illustrated as the channel 720, the number of active fins is not limited thereto.

The substrate 710 may be a semiconductor substrate. For example, the semiconductor substrate may include any one of silicon, silicon-on-insulator (SOI), silicon-on-sapphire (silicon-on-sapphire), germanium, silicon-germanium and gallium-arsenide.

The active fin 722 and the dummy fin 724 may be disposed to be connected to the substrate 710. In an embodiment, the active fin 722 may be an active region doped with a part protruding from the substrate 710 to a vertical part with n+ or p+, and the dummy fin 724 may be a region that is not doped with the part protruding from the substrate 710 to the vertical part. In another embodiment, both the active fin 722 and the dummy fin 724 may be active regions doped with n+ or p+.

Each of the active fins 722 may have a width and a height, and the width and the height of the active fins 722 may determine the width and height of a channel layer. The width and the height of the channel 720 may increase by the number of the active fins 722.

The gate insulating layer 750 may be disposed on the active fin 722 and the dummy fin 724. The gate insulating layer 750 may include any one of an oxide layer, a nitride layer, or an oxynitride layer.

The spacer 760 may be disposed to have a desired and/or alternatively predetermined height in a space between the active fin 722 and the dummy fin 724. The spacer 760 may be formed of a material having a low dielectric constant by including at least one of the amorphous boron nitride layer a-BN and nanocrystalline boron nitride layer nc-BN according to an embodiment. The spacer 760 may further include a dielectric material having a low dielectric constant in addition to the boron nitride layer according to an embodiment. The spacer 760 may be disposed between the active fin 722 and the dummy fin 724, such that the spacer 760 may be used as a device isolation layer as well as may reduce parasitic capacitance.

The gate 740 may be disposed on the upper portions of the gate insulating layer 750 and the spacer 760. Accordingly, the gate 740 may have a structure surrounding the active fin 722, the dummy fin 724 and the spacer 760. In other words, the active fin 722 and the dummy fin 724 may have a structure disposed inside the gate 740. The gate 740 may include metal materials such as W, Ta, etc., nitrides thereof, silicides thereof, doped polysilicon, etc., and may be formed using a deposition process.

In addition to the amorphous boron nitride layer a-BN and nanocrystalline boron nitride layer nc-BN of the low dielectric constant according to an embodiment, what may be used in various electronic apparatuses.

Figure 30A:
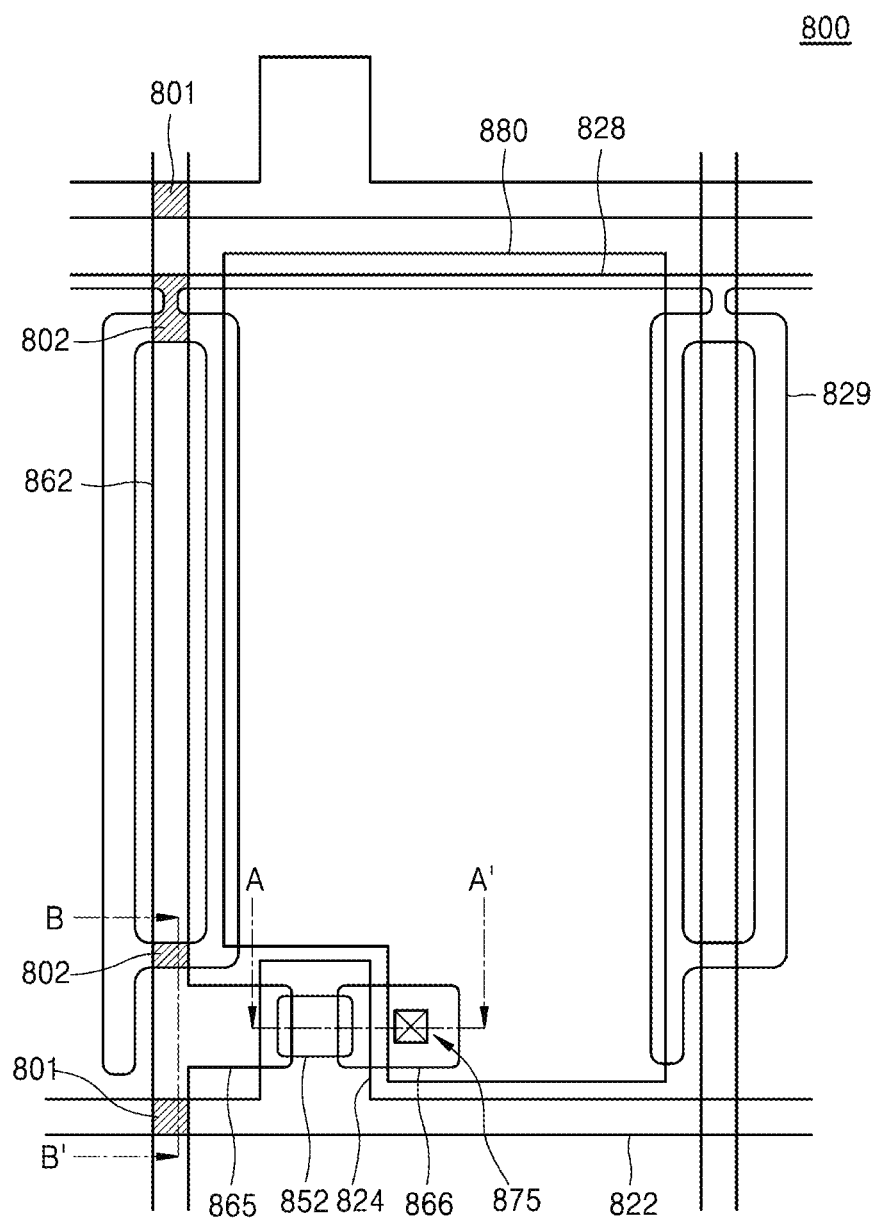
FIG. 30A is a diagram illustrating a part of a display apparatus including a boron nitride layer according to an embodiment.
Figure 30B:
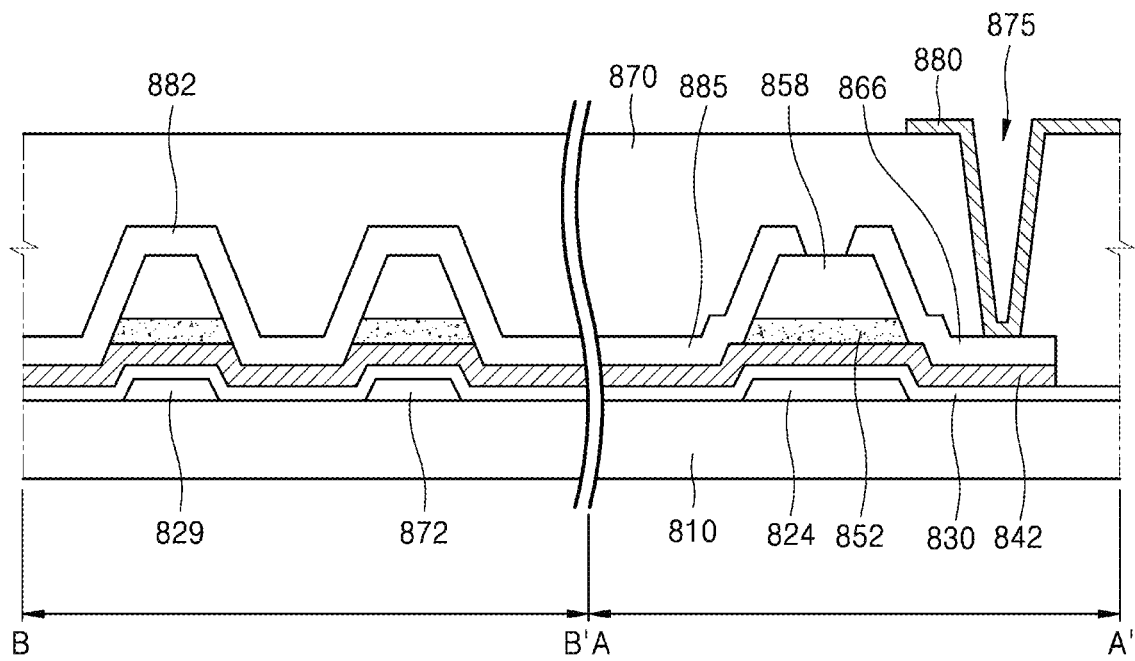
FIG. 30B is a cross-sectional view taken along lines A-A' and B-B' of FIG. 30A.

FIGS. 30A and 30B are diagrams illustrating a part of a display apparatus 800 including a boron nitride layer according to an embodiment. FIG. 30A is a diagram illustrating the part of the display apparatus 800 including the boron nitride layer according to an embodiment, and FIG. 30B is a cross-sectional view taken along line A-A' and B-B' of FIG. 30A.

Referring to FIGS. 30A and 30B, gate wires 822 and 824 for transmitting a gate signal are formed on an insulating substrate 810. The gate wires 822 and 824 include the gate line 822 extending in one direction, for example, a horizontal direction, and the gate 824 of a thin film transistor formed by protruding in a protrusion shape from the gate line 822.

In addition, storage wires 828 and 829 for transmitting a storage voltage are formed on the insulating substrate 810. The storage wires 828 and 829 include the storage line 828 formed substantially parallel to the gate line 822 across a pixel region, and the storage electrode 829 branched from the storage line 828 and extending parallel to a data line 862.

The storage electrode 829 may be formed in the form of a square ring formed along the data line 862. That is, an opening region is formed in the center of the storage electrode 829 such that the data line 862 is positioned, and at least a part of the ring portion of the storage electrode 829 overlaps with a pixel electrode 880.

The shape and arrangement of the storage electrode 829 and the storage line 828 may be modified in various forms, and when the storage capacitance caused by the overlap of the pixel electrode 880 and the gate line 822 is sufficient, the storage electrode 829 and the storage line 828 may not be formed.

The gate wires 822 and 824 and the storage wires 828 and 829 may include aluminum-based metals such as aluminum (Al) and aluminum alloys, silver-based metals such as silver (Ag) and silver alloys, copper-based metals such as copper (Cu) and copper alloys, molybdenum-based metals such as molybdenum (Mo) and molybdenum alloys, chromium (Cr), titanium (Ti), and tantalum (Ta). In addition, the gate wires 822 and 824 and the storage wires 828 and 829 may have a multilayer structure including two conductive layers (not shown) having different physical properties. One of these conductive layers includes a metal having low resistivity, for example, aluminum-based metal, silver-based metal, copper-based metal, etc. to reduce the signal delay or the voltage drop of the gate wires 822 and 824 and the storage wires 828 and 829. Unlike this, the other conductive layer includes a material having excellent contact properties with other materials, particularly zinc oxide (ZnO), indium tin oxide (ITO), and indium zinc oxide (IZO), such as molybdenum-based metals, chromium (Cr), titanium (Ti), tantalum (Ta), etc. Good examples of such a combination include a chromium lower layer and an aluminum upper layer, an aluminum lower layer and a molybdenum upper layer, and a titanium lower layer and a copper upper layer. However, the present disclosure is not limited thereto, and the gate wires 822 and 824 and the storage wires 828 and 829 may include various metals and conductors.

A gate insulating layer 830 is formed on the insulating substrate 810, the gate wires 822 and 824 and the storage wires 828 and 829. The gate insulating layer 830 may include silicon oxide (SiOx), silicon nitride (SiNx), silicon oxynitride (SiON), etc. Specifically, the gate insulating layer 830 may be formed as a single layer or a multiple layer, and when formed as the multiple layer, may have a structure in which silicon nitride and silicon oxide are stacked. In this case, the gate insulating layer 830 may be formed as a silicon oxide layer in a region in contact with an oxide semiconductor layer pattern 842, and a nitrogen oxide layer may be disposed on the lower portion of the silicon oxide layer. When the silicon oxide layer is in contact with the oxide semiconductor layer pattern 842, deterioration of the oxide semiconductor layer pattern 842 may be prevented. When the gate insulating layer 830 is formed as a silicon oxynitride layer, the oxygen concentration distribution in the silicon oxynitride layer may be provided. Also in this case, by increasing the oxygen concentration as the oxygen concentration approaches the oxide semiconductor layer pattern 842, deterioration of the oxide semiconductor layer pattern 842 may be prevented.

The oxide semiconductor layer pattern 842 for forming a channel of the thin film transistor is formed on the gate insulating layer 830. A channel region is formed by the oxide semiconductor layer pattern 842 overlapping the gate wire 824. In the present embodiment, the oxide semiconductor layer pattern 842 is formed to have substantially the same shape as data wires 862, 865, and 866 to be described later, except for the channel region. This is because the oxide semiconductor layer pattern 842 and the data wires 862, 865, and 866 are patterned using one etching mask in a process of manufacturing the thin film transistor substrate of the present embodiment which will be described later. In other words, the oxide semiconductor layer pattern 842 has the same shape as the data wires 862, 865, and 866, except that the oxide semiconductor layer pattern 842 is formed in the channel region.

The oxide semiconductor layer pattern 842 includes, for example, a compound having a formula expressed in AxBxOx or AxBxCxOx. A includes Zn or Cd, B includes Ga, Sn or In, and C includes Zn, Cd, Ga, In, or Hf. X is not 0, and A, B and C are different. According to another embodiment, The oxide semiconductor layer pattern 842 may include any one material selected from the group consisting of InZnO, InGaO, InSnO, ZnSnO, GaSnO, GaZnO, GaZnSnO, GaInZnO, HfInZnO and ZnO. Such an oxide semiconductor has excellent semiconductor properties with an effective mobility of about 2 to about 100 times higher than that of hydrogenated amorphous silicon.

An etch prevention pattern 852 is formed on the oxide semiconductor layer pattern 842. Here, the etch prevention pattern 852 is formed on each of a thin film transistor region where the gate wire 824 and source/drain electrodes 865 and 866 overlap, a region where the gate wire 822 and the data wire 862 overlap (hereinafter, referred to as a first overlap region, see reference numeral 'O1' in FIG. 1), and a region where the storage wires 828 and 829 and the data wire 862 overlap (hereinafter referred to as a second overlap region, see reference numeral 'O2' in FIG. 1).

The etch prevention pattern 852 formed in the thin film transistor region is to prevent the oxide semiconductor layer pattern 842 from being damaged by plasma, etching solution, or etching gas during a subsequent etching process or deposition process. This is because when the oxide semiconductor layer pattern 842 is damaged by plasma, etching solution, or etching gas, the performance of the thin film transistor may significantly deteriorate. Accordingly, the etch prevention pattern 852 formed on the thin film transistor region may cover the oxide semiconductor layer pattern 842, and in particular, enough to cover the channel region. That is, in order to prevent the oxide semiconductor layer pattern 842 from being exposed in the channel region, the etch prevention pattern 852 may be formed in a region overlapping the channel region to be wider in the longitudinal direction of the channel than the channel region.

Meanwhile, the etch prevention pattern 852 formed in the first overlap region O1 is to reduce the capacitance generated between the gate wire 822 and the data wire 862 in the first overlap region O1, and the etch prevention pattern 852 formed in the second overlap region O2 is to reduce the capacitance generated between the storage wires 828 and 829 and the data wire 862 in the second overlap region O2. This is because the capacitance generated between the gate wire 822 and the data wire 862 or the capacitance generated between the storage wires 828 and 829 and the data wire 862 causes a RC delay. Accordingly, the etch prevention pattern 852 is formed on the oxide semiconductor layer pattern 842 of the first overlap region O1 and the second overlap region O2.

The etch prevention pattern 852 includes an insulating material, and may include, for example, any one material selected from the group consisting of SiOx and SiNx.

The data wires 862, 865 and 866 are formed on the gate insulating layer 830, the oxide semiconductor layer pattern 842, and the etch prevention pattern 852. The data wires 862, 865, and 866 include the data wire 862 formed in a direction different from the gate wire 822, for example, in a vertical direction to cross the gate wire 822 and define a pixel, the source electrode 865 branched from the data wire 862 in the form of a branch and extending to the upper portions of the oxide semiconductor layer pattern 842 and the etch prevention pattern 852 of the thin film transistor region, and the drain electrode 866 spaced from the source electrode 865 and formed on the upper portions of the oxide semiconductor layer pattern 842 and the etch prevention pattern 852 of the thin film transistor region to face the source electrode 865 with respect to the gate wire 824.

The etch prevention pattern 852 is exposed at least partially between the source electrode 865 and the drain electrode 866. The oxide semiconductor layer pattern 842 is disposed on the lower portions of the etch prevention pattern 852, the source electrode 865, and the drain electrode 866. That is, the oxide semiconductor layer pattern 842 completely overlaps the etch prevention pattern 852, the source electrode 865, and the drain electrode 866. As described above, the source electrode 865 and the drain electrode 866 have substantially the same shape as the oxide semiconductor layer pattern 842 except for a separation region overlapping with the channel region.

The data wires 862, 865, and 866 may be formed as a single layer structure or a multilayer structure including Ni, Co, Ti, Ag, Cu, Mo, Al, Be, Nb, Au, Fe, Se, W, Ru, or Ta.

Also, an alloy including one or more elements selected from Ti, Zr, W, Ta, Nb, Pt, Hf, O, C, and N may be applied to the metal. Examples of the multilayer structure include a double layer such as Ti/Cu, Ta/Al, Ta/Al, Ni/Al, Co/Al, Mo (Mo alloy)/Cu, etc., or a triple layer such as Mo/Al/Mo, Ti/Al/Ti, Ta/Al/Ta, Ti/Al/TiN, Ta/Al/TaN, Ni/Al/Ni, Co/Al/Co, etc. However, the data wires 862, 865, and 866 are not limited to the above-described materials.

A low-k dielectric material pattern 858 may be further provided on the etch prevention pattern 852. The low-k material pattern 858 may be formed to have substantially the same shape as the etch prevention pattern 852.

The low dielectric material pattern 858 may include a material having a low dielectric constant compared to a silicon nitride layer, that is, a low dielectric material having a relative dielectric constant less than 3. The low-k material pattern 858 described above may include at least one of the amorphous boron nitride layer a-BN and the nanocrystalline boron nitride layer nc-BN according to an embodiment.

Further forming the low-k material pattern 858 on the etch prevention pattern 852 is to shorten a process time while further reducing the capacitance generated between the gate wire 822 and the data wire 862 in the first overlap region O1 and the capacitance generated between the storage wires 828 and 829 and the data wire 862 in the second overlap region O2.

That is, as the sum of the thickness of the etch prevention pattern 852 and the thickness of the low-k material pattern 858 increases, the capacitance generated between the gate wire 822 and the data wire 862 in the first overlap region O1 and the capacitance generated between the storage wires 828 and 829 and the data wire 862 in the second overlap region O2 are further reduced.

In addition, it is preferable that the thickness of the low-k material pattern 858 is greater than the thickness of the etch prevention pattern 852, and thus the process time may be shortened.

In the present embodiment, the structure in which the low dielectric material pattern 858 is stacked on the etch prevention pattern 852 is described, but the present disclosure is not limited thereto, and the stack order may be reversed. That is, the etch prevention pattern 852 may be stacked on the low-k material pattern 858.

A passivation layer 870 is formed on the data wires 862, 865, and 866 and the etch prevention pattern 852 exposed through the data wires 862, 865, and 866. The passivation layer 870 may include silicon oxide (SiOx), silicon nitride (SiNx), silicon oxynitride (SiON), etc., like the gate insulating layer 830. According to an embodiment, the passivation layer 870 may include a double layer including silicon nitride (SiNx) and silicon oxide (SiOx).

A contact hole 875 exposing a part of the drain electrode 866 is formed in the passivation layer 870.

The pixel electrode 880 electrically connected to the drain electrode 866 through the contact hole 875 is formed on the passivation layer 870. The pixel electrode 880 may include a transparent conductor such as indium tin oxide (ITO) or indium zinc oxide (IZO) or a reflective conductor such as aluminum.

The pixel electrode 880 to which a data voltage is applied may control light emission in a pixel region (not shown) together with a common electrode of an upper substrate facing the thin film transistor substrate.

Figure 31:
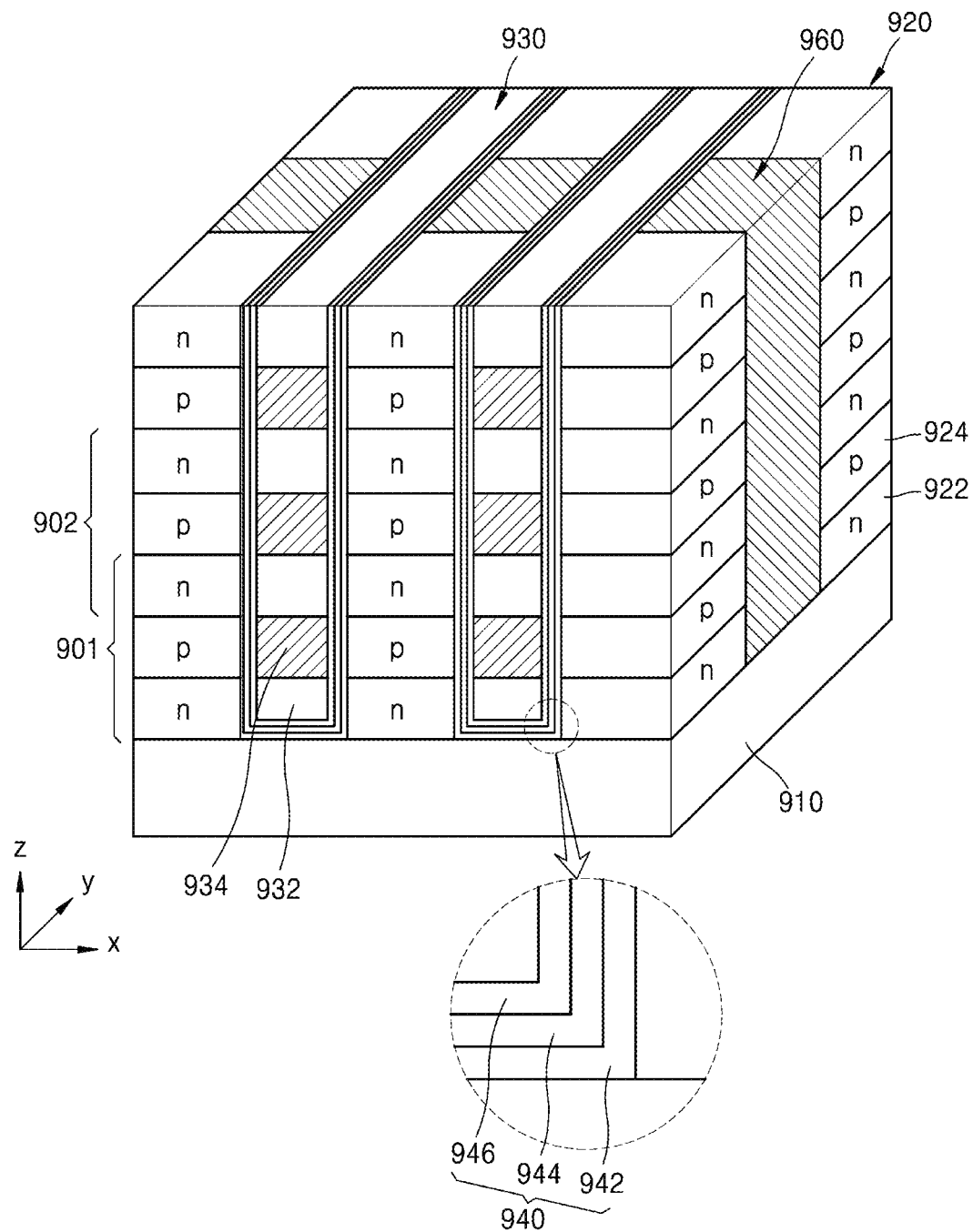
FIG. 31 is a diagram illustrating a NAND flash memory device including a boron nitride layer according to an embodiment.

FIG. 31 is a diagram illustrating a NAND flash memory device 900 including a boron nitride layer according to an embodiment. Memory cells of the NAND flash memory device 900 may be arranged three dimensionally on a substrate 910.

The substrate 910 may be a semiconductor substrate 910 such as a Si single crystal substrate, a compound semiconductor substrate, a silicon on insulator (SOI) substrate 910, and a strained substrate. In an embodiment, a semiconductor layer may be formed in a peripheral circuit region defined on a lower portion of a 3D NAND flash memory cell, and the semiconductor layer itself may be the substrate 910. The embodiment of the present disclosure is not limited thereto, for example, in another embodiment, the substrate 910 may be a ceramic substrate 910 or a polymer substrate for implementing a flexible device, or even a fabric layer. The substrate 910 may be provided with wire such as an impurity region (not shown) or a conductive layer (not shown) by doping.

On the substrate 910, a plurality of semiconductor structures 920 spaced apart from the substrate 910 in a horizontal direction (e.g., the first direction X and the second direction Y) may be arranged. The semiconductor structure 920 may include metal oxide. The above-described metal oxide may include oxygen vacancies, and these oxygen vacancies may be locally formed in the depth direction in the semiconductor structure 920. The semiconductor structure 920 may have at least one of a covalent bond and an ionic bond between a metal element constituting a metal oxide and an oxygen atom. The metal element may include zinc, nickel, niobium, titanium, zirconium, hafnium, vanadium, molybdenum, magnesium, cobalt, iron, copper, aluminum, manganese, or combinations thereof. For example, the metal oxide may be zinc oxide. Further, the metal oxide may be doped with an impurity element such as indium or gallium to the metal oxide. For example, the metal oxide may include indium-gallium-zinc oxide (IGZO). The metal oxide may have a polycrystalline structure, an amorphous structure, a structure in which nano crystal grains are dispersed, or a mixed structure thereof. For example, the metal oxide may have an amorphous structure or a structure in which nano crystal grains are dispersed in the amorphous structure.

Each of the plurality of semiconductor structures 920 may be alternately arranged with semiconductor layers doped with different dopants in a direction perpendicular to the substrate 910. For example, a first doping layer 922 doped with an n-type dopant in a third direction and a second doping layer 924 doped with a p-type dopant are alternately arranged, but are not limited thereto.

A gate structure 930 may be disposed between the semiconductor structures 920 neighboring in a first direction with respect to the substrate 910. In the gate structure 930, an insulating layer 932 and a gate 934 may be alternately arranged in a direction perpendicular to the substrate 910, for example, in the third direction (the Z direction). The insulating layer 932 and the gate 934 of the gate structure 930 may be respectively arranged to correspond to the first doping layer 922 doped with a first dopant of the semiconductor structure 920 and the second doping layer 924 doped with a second dopant. For example, the insulating layer 932 may be arranged in parallel with the first doping layer 922 doped with the n-type dopant, and the gate 934 may be arranged in parallel with the second doping layer 924 doped with the p-type dopant.

An information storage layer 940 may be further disposed between the gate structure 930 and the semiconductor structure 920. The information storage layer 940 may surround the gate structure 930 and may be individualized by separating between adjacent memory cells. The information storage layer 940 may include a charge blocking layer 942 on the semiconductor structure 920, a data storage layer 944 on the charge blocking layer 942, and a blocking insulating layer 946 on the data storage layer 944.

The charge blocking layer 942 may include any one selected from the group consisting of $SiO_2$, $Si_3N_4$, SiON, $HfO_2$, HfSiO, $Al_2O_3$, and $ZrO_2$, or a combination thereof. The data storage layer 944 may include a dielectric matrix and silicon nano crystals (NC) dispersed in the dielectric matrix. The dielectric matrix may include at least one dielectric material selected from the group consisting of $SiO_2$, SiON, $Si_3N_4$, SRN (Si rich nitride), $HfO_2$, HfSiO, HfSiON, HfON, HfAlO, $Al_2O_3$ and AlN. The blocking insulating layer 946 may include any one selected from the group consisting of $Al_2O_3$, $SiO_2$, $HfO_2$, $ZrO_2$, $Ta_2O_5$, LaO, LaAlO, LaHfO, and HfAlO, or a combination thereof.

The aforementioned materials of the dielectric matrix of the data storage layer 944, the charge blocking layer 942, and the blocking insulating layer 946 are examples and other known materials may be employed. For example, the information storage layer 940 may have a stack structure of various materials, such as a SONOS (polysilicon-silicon dioxide-silicon nitride-silicon dioxide-Silicon) structure, a SANOS (polysilicon-alumina-silicon nitride-silicon dioxide-Silicon) structure, a TANOS (Tantalum or titanium nitride-alumina-silicon nitride-silicon dioxide-Silicon) structure, a MANOS (metal-alumina-silicon nitride-silicon dioxide-Silicon) structure, or a Be-MANOS (metal-alumina-silicon nitride-Band engineered oxide-Silicon) structure, in the stack order of the gate 934, the gate insulating layer 932, the blocking insulating layer 946, the data storage layer 944, the charge blocking layer 942, and the substrate 910. However, it is obvious that each of the materials of the information storage layer 940 is an example and other candidate materials may be applied.

The NAND flash memory device 900 may be divided into a selection device 901 and a string device 902, wherein a region including the lower end of the gate structure 930 or the upper end of the gate structure 930 may be the selection device 901, and a region including the intermediate end of the gate structure 930 may be the string device 902.

For example, the p-type doped second doping layer 924 disposed on the lowermost end of the semiconductor structure 920, a pair of n-type doped first doping layers 922 adjacent to the second doping layer 924 described above, the gate 934 corresponding to the p-type doped second doping layer 924 and the information storage layer 940 between the second doping layer 924 and the gate 934 may be the selection device 901. The second doping layer 924 disposed on the lowermost end of the semiconductor structure 920 may function as a channel region, and the pair of n-type doped first doping layers 922 adjacent to the second doping layer 924 may be respectively source and drain.

The p-type doped second doping layer 924 disposed in the center region of the semiconductor structure 920, the pair of n-type doped first doping layers 922 adjacent to the second doping layer 924 described above, the gate 934 corresponding to the p-type doped second doping layer 924 and the information storage layer 940 between the second doping layer 924 and the gate 934 may be the string device 902. The second doping layer 924 disposed in the center region of the semiconductor structure 920 may function as a channel, and the pair of n-type doped first doping layers 922 adjacent to the second doping layer 924 may be respectively source and drain.

A spacer 960 may be disposed between the semiconductor structures 920 neighboring in the second direction with respect to the substrate 910. The spacer 960 may electrically separate neighboring memory strings. The spacer 960 may be an insulating material including at least one of the amorphous boron nitride layer a-BN and the nanocrystalline boron nitride layer nc-BN according to an embodiment. Since the amorphous boron nitride layer a-BN and the nanocrystalline boron nitride layer nc-BN are low-k materials, the amorphous boron nitride layer a-BN and the nanocrystalline boron nitride layer nc-BN may not only insulate the electrical properties of the neighboring memory strings but also reduce the generation of parasitic capacitance. The spacer 960 may further include a dielectric material having a low dielectric constant in addition to the boron nitride layer according to an embodiment.

In the above, although the embodiment of a boron nitride layer having a low dielectric constant has been illustrated and described above, the present disclosure is not limited to the specific embodiments described above, and does not depart from the gist of the present disclosure as claimed in the claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic apparatus, comprising:
a substrate; and
a source and a drain spaced apart from each other on the substrate;
a channel structure connected to the source and the drain;
a gate structure on the channel structure between the source and drain; and
a spacer at least one of between the gate structure and the source and between the gate structure and the drain,
wherein, the spacer includes a boron nitride layer having a boron nitride compound and,
the boron nitride layer has a mass density of about 1 to about 3 $g/cm^3$ and a dielectric constant of about 2.5 or less.

2. The electronic apparatus of claim 1, wherein
the channel structure includes a plurality of channels spaced apart from each other in a direction perpendicular to a surface of the substrate,
and the spacer is between the plurality of channels.

3. The electronic apparatus of claim 2, wherein,
the plurality of channels each form an edge contact with the source and an edge contact with the drain,
portions of the gate structure extend between the plurality of channels such that the portions of the gate structure and the plurality of channels are alternately arranged in the direction perpendicular to the surface of the substrate,
the spacer includes a first spacer and a second spacer apart from each other on the substrate,
the plurality of channels and portions of the first spacer are alternately arranged in the direction perpendicular to the surface of the substrate, and
the plurality of channels and portions of the second spacer are alternately arranged in the direction perpendicular to the surface of the substrate.

4. The electronic apparatus of claim 1, wherein
the channel structure extends in a direction perpendicular to a surface of the substrate,
the spacer includes a first spacer and a second spacer apart from each other in the direction perpendicular to a surface of the substrate.

5. The electronic apparatus of claim 4, wherein
the first spacer is between the gate structure and the source and the second spacer is between the gate structure and the drain.

6. The electronic apparatus of claim 4, wherein
the gate structure is between the first spacer and the second spacer in a direction parallel to a surface of the substrate.

7. The electronic apparatus of claim 4, wherein
at least one of the first spacer and the second spacer is connected to the channel structure.

8. The electronic apparatus of claim 7, wherein
the at least one of the first spacer and the second spacer is in contact with the gate structure.

9. The electronic apparatus of claim 1, wherein
the substrate includes a fin structure protruding from the substrate between the source and the drain,
the spacer is on a side wall of the fin structure.

10. The electronic apparatus of claim 1, further comprising:
a gate insulating layer on the substrate; and,
wherein the gate insulating layer extends between the fin structure and the first spacer.

11. The electronic apparatus of claim 1, further comprising:
a gate line between the spacer and the substrate.

12. The electronic apparatus of claim 1, wherein
the boron nitride compound is at least one of amorphous and nanocrystalline.

13. The electronic apparatus of claim 1, wherein
a ratio of boron to nitrogen of the boron nitride compound is about 0.9 to about 1.1, and
the boron nitride compound has a hydrogen content of about 10% or less.

14. The electronic apparatus of claim 1, wherein
a roughness of the spacer is about 0.3 to about 0.6 root-mean-square (RMS).

15. The electronic apparatus of claim 1, wherein
the boron nitride compound comprises a $sp^2$ bond, and the boron nitride compound has a dielectric constant of about 2.3 to about 2.5 at an operating frequency of 100 kHz.

16. An electronic apparatus, comprising:
a substrate; and
a channel structure on the substrate;
a first electrode and a second electrode on the channel structure;
a third electrode electrically connected to the channel structure;
a spacer between the first electrode and the second electrode, wherein
the spacer includes a boron nitride layer having a boron nitride compound, and
the boron nitride layer has a mass density of about 1 to about 3 g/cm$^3$ and a dielectric constant of about 2.5 or less.

17. The electronic apparatus of claim 16, wherein
the channel structure includes a plurality of channels spaced apart from each other in a direction perpendicular to a surface of the substrate,
and the spacer is between the plurality of channels.

18. The electronic apparatus of claim 16, wherein
the channel structure extends in a direction perpendicular to a surface of the substrate,
the spacer includes a first spacer and a second spacer apart from each other in the direction perpendicular to a surface of the substrate.

19. The electronic apparatus of claim 16, wherein
the substrate includes a fin structure protruding from the substrate between the first electrode and the second electrode,
the spacer is on a side wall of the fin structure.

20. An electronic apparatus, comprising:
a substrate; and
a channel structure on the substrate;
an electrode on the channel structure; and
a spacer on at least one surface of the electrode,
wherein, the spacer includes a boron nitride layer having a boron nitride compound,
the boron nitride compound comprises a sp2 bond,
the boron nitride layer has a mass density of about 1 to about 3 g/cm$^3$, and,
a ratio of boron to nitrogen of the boron nitride layer is about 0.9 to about 1.1.

* * * * *